(12) United States Patent
Hwang et al.

(10) Patent No.: US 8,822,285 B2
(45) Date of Patent: Sep. 2, 2014

(54) NONVOLATILE MEMORY DEVICE AND METHOD OF MANUFACTURING THE SAME

(75) Inventors: Sung Min Hwang, Gyeonggi-do (KR); Il Seok Seo, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 169 days.

(21) Appl. No.: 13/605,957

(22) Filed: Sep. 6, 2012

(65) Prior Publication Data
US 2013/0161821 A1 Jun. 27, 2013

(30) Foreign Application Priority Data
Dec. 22, 2011 (KR) .......................... 10-2011-0139987

(51) Int. Cl.
*H01L 21/336* (2006.01)
*H01L 29/792* (2006.01)
*H01L 27/115* (2006.01)

(52) U.S. Cl.
CPC .................................. *H01L 27/11551* (2013.01)
USPC ..................... 438/257; 257/324; 257/E27.104

(58) Field of Classification Search
CPC ................................................ H01L 27/11551
USPC ........................... 438/257; 257/324, E27.104
See application file for complete search history.

(56) References Cited

U.S. PATENT DOCUMENTS

| | | | |
|---|---|---|---|
| 8,178,917 B2 * | 5/2012 | Tanaka et al. | 257/324 |
| 2010/0207186 A1 * | 8/2010 | Higashi et al. | 257/314 |
| 2011/0156132 A1 * | 6/2011 | Kiyotoshi | 257/326 |
| 2012/0119287 A1 * | 5/2012 | Park et al. | 257/329 |

FOREIGN PATENT DOCUMENTS

KR 1020110015338 2/2011

\* cited by examiner

*Primary Examiner* — Luan C Thai
(74) *Attorney, Agent, or Firm* — IP & T Group LLP

(57) ABSTRACT

A nonvolatile memory device includes a substrate including a cell region, contact regions and dummy contact regions. The contact regions and the dummy contact regions alternately are disposed. A plurality of word lines stacked at the cell region of the substrate and contact groups stacked at the contact regions and the dummy contact regions of the substrate. The contact groups include a plurality of pad layers being coupled to the word lines, and each of the contact groups has stepped structure disposed at a corresponding contact region.

15 Claims, 19 Drawing Sheets

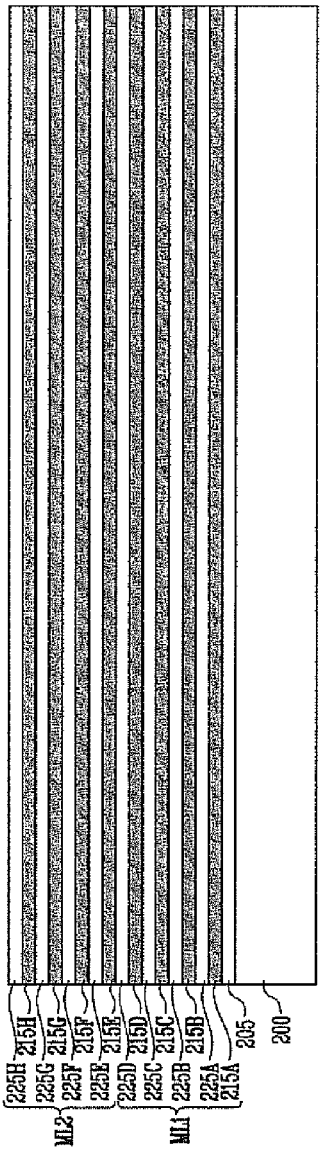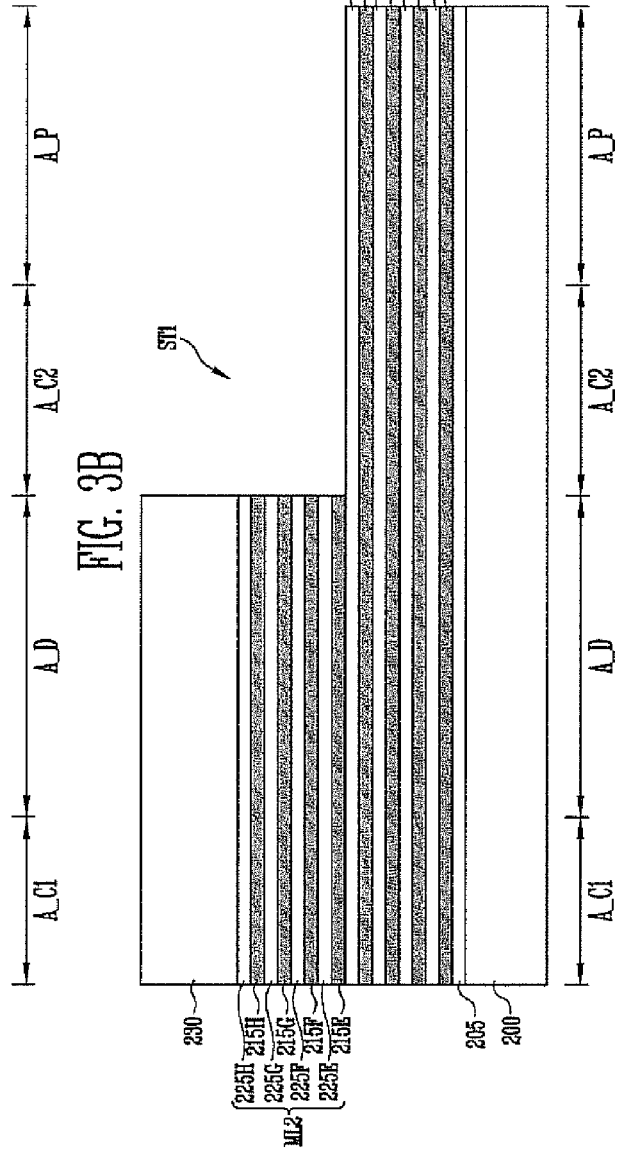

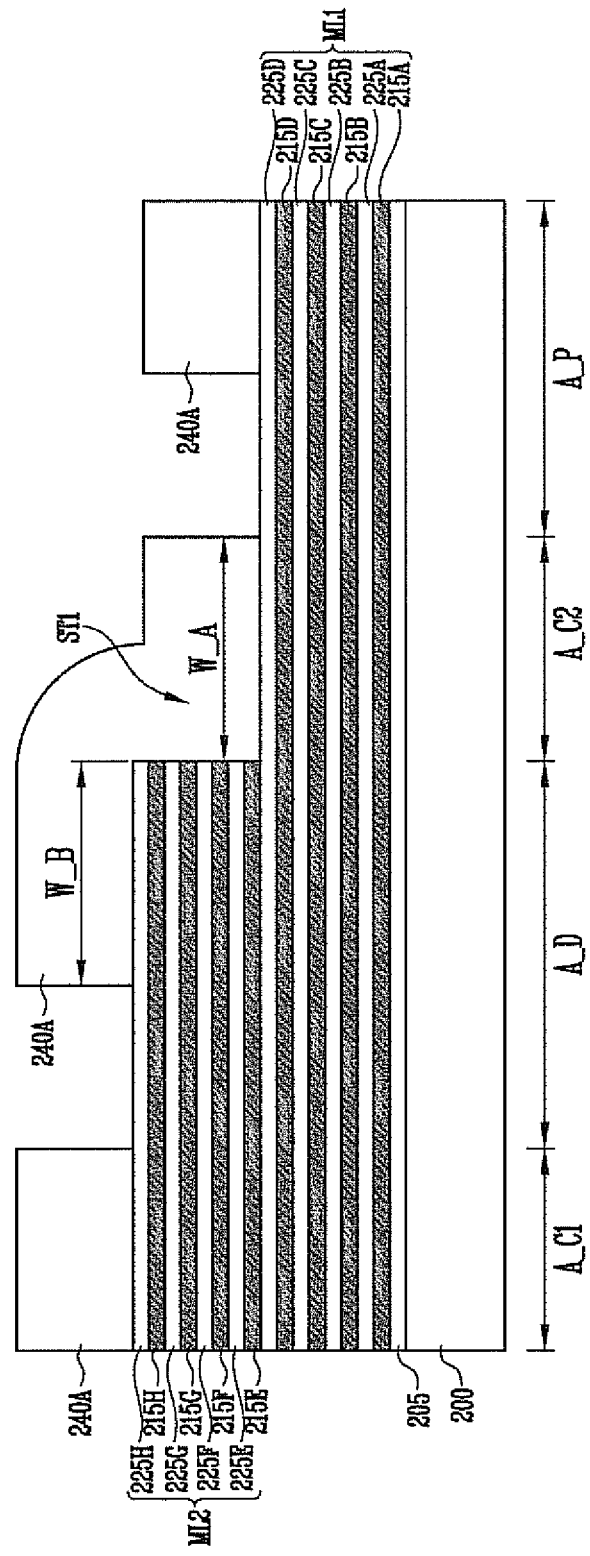

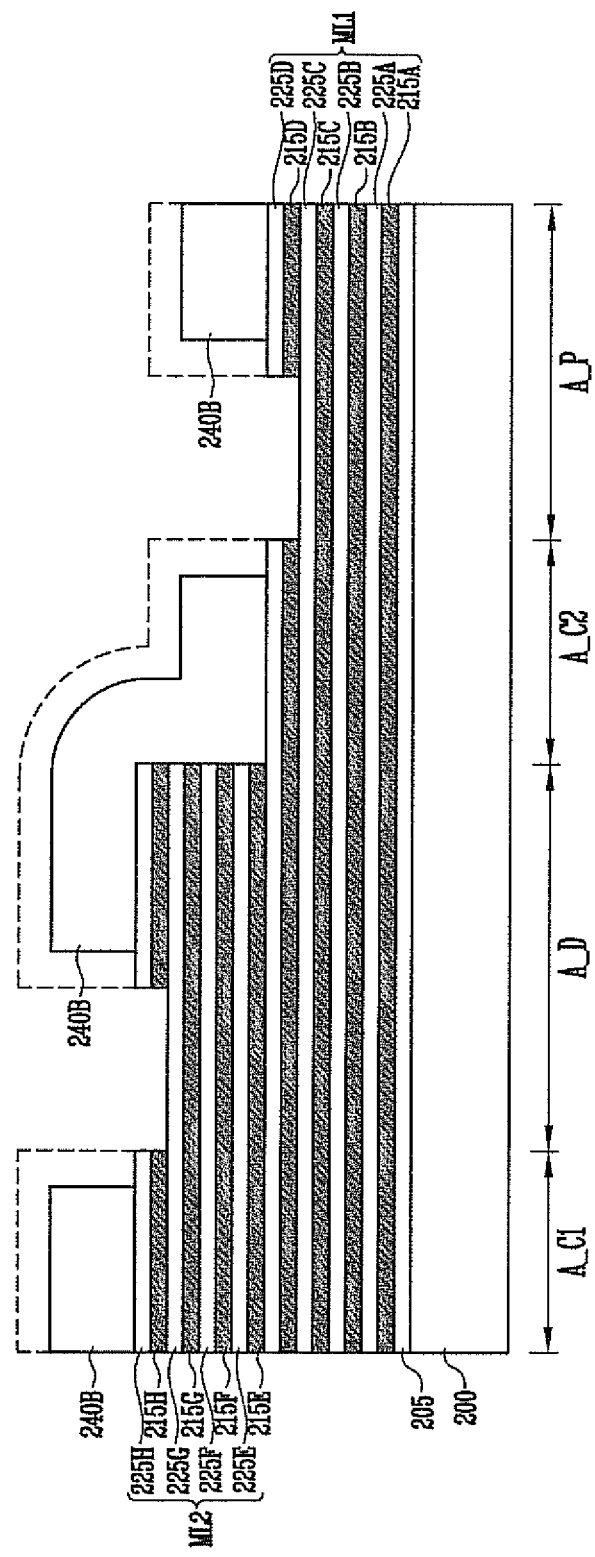

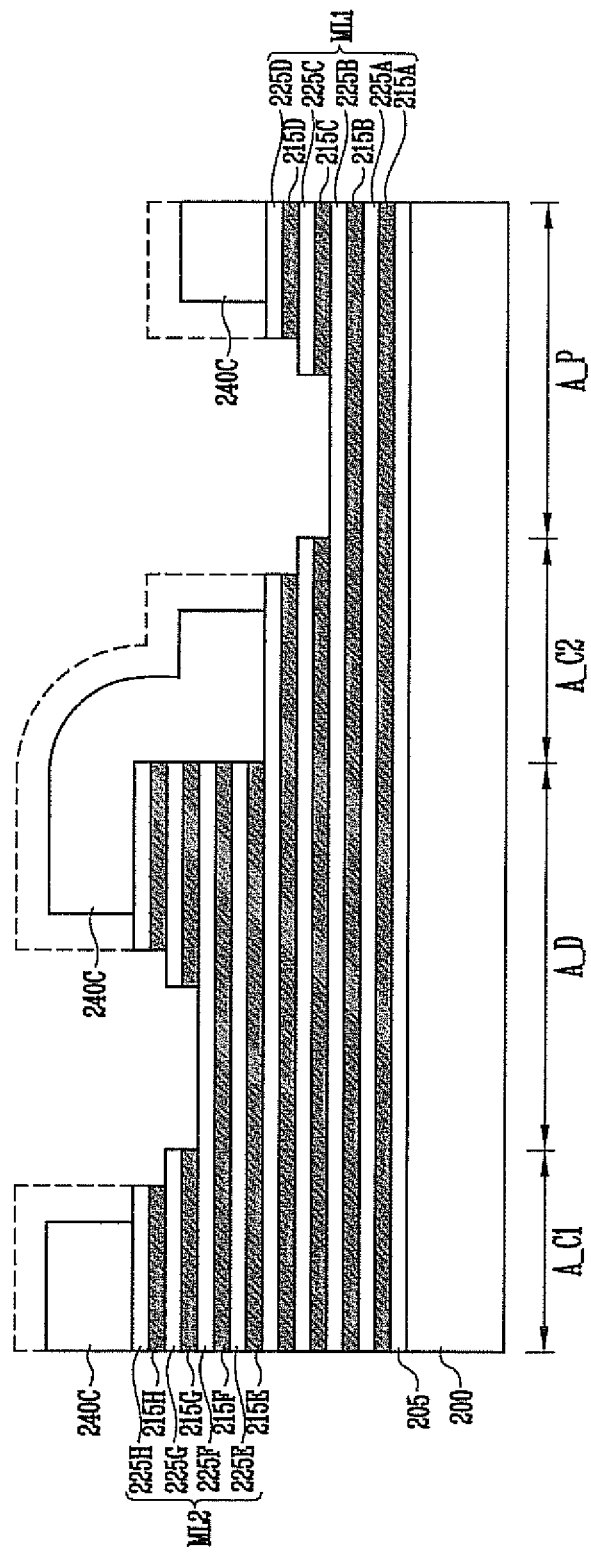

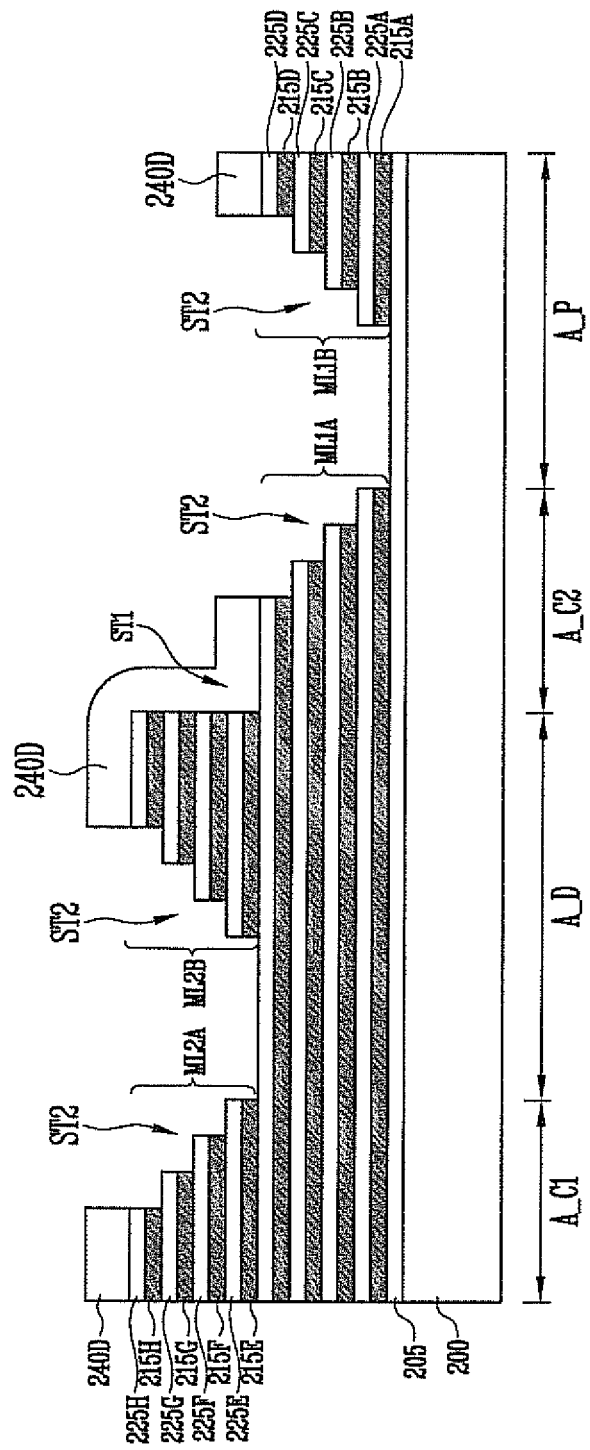

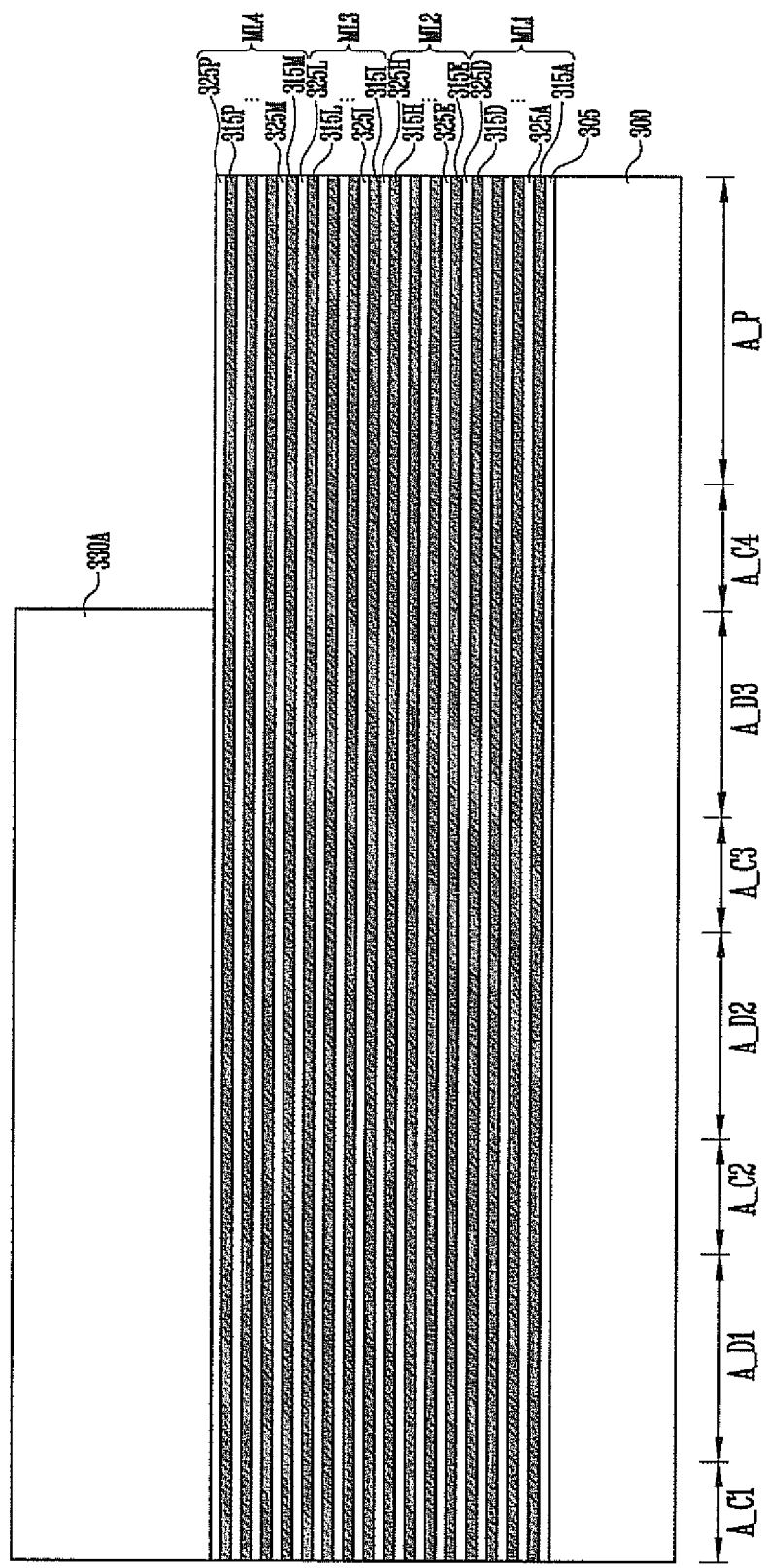

NONVOLATILE MEMORY DEVICE AND METHOD OF MANUFACTURING THE SAME

CROSS-REFERENCE TO RELATED APPLICATION

Priority to Korean patent application number 10-2011-0139987 filed on Dec. 22, 2011, the entire disclosure of which is incorporated by reference herein, is claimed.

BACKGROUND

Embodiments of this disclosure relate to a semiconductor device and a method of manufacturing the same and, more particularly, to a nonvolatile memory device and a method of manufacturing the same.

Technology for semiconductor devices is focused on an increase in a degree of integration. In order to increase the degree of integration of semiconductor devices, schemes for reducing the size of memory cells arranged in a 2-D way have been developed. But, a reduction in the size of the memory cells arranged in a 2-D way is limited. In order to overcome the limit, a 3-D semiconductor device in which memory cells are arranged in a 3-D way over a substrate has been proposed. The 3-D semiconductor device may efficiently utilize the area of the substrate and increase the degree of integration as compared with the case where the memory cells are arranged in a 2-D way.

A conventional 3-D structured memory device includes a plurality of gate lines stacked over a substrate. An interlayer insulating layer is interposed between adjacent the gate lines, thus insulating the gate lines from each other. A contact plug is coupled to each of the gate lines. To this end, the sides of the gate lines are stepwise patterned so that the contact regions of the gate lines to be coupled to the contact plugs are exposed.

FIGS. 1A to 1E are cross-sectional views illustrating a known method of manufacturing a conventional 3-D nonvolatile memory device. For simplicity, FIGS. 1A to 1E illustrate only the contact regions of the 3-D nonvolatile memory device.

Referring to FIG. 1A, a stack structure is formed by alternately stacking a plurality of interlayer insulating layers 10A to 10I and a plurality of conductive layers 20A to 20H over a substrate (not shown). Next, although not shown, processes of forming memory cells arranged in the form of a 3-D structure in memory cell regions are performed.

A mask pattern 30 for forming contact regions is formed on the interlayer insulating layers 10A to 10I and the conductive layers 20A to 20H. The mask pattern 30 may be a photoresist pattern formed by depositing a photoresist layer on the interlayer insulating layers 10A to 10I and the conductive layers 20A to 20H and patterning the photoresist layer using exposure and development processes.

Referring to FIG. 1B, the interlayer insulating layer 10I, which is the uppermost layer, and the conductive layer 20H, which is the uppermost layer, are etched using the mask pattern 30 as an etch barrier. Thus, a step ① is formed in the stack structure. It is noted that the step numbers refer to a position of a step in the stacked structure and not to an order in which the steps were formed. For example, step ① refers to the lowest existing step of the stacked structure, while step ② will refer to the next higher existing step. Next, a width of the mask pattern 30 is reduced by a width of a contact region by etching the mask pattern 30. Here, not only the width of the mask pattern 30, but also a thickness of the mask pattern 30 is reduced.

Referring to FIG. 1C, the interlayer insulating layer 10I and the conductive layer 20H are etched using the reduced mask pattern 30 as an etch barrier. The interlayer insulating layer 10I and the conductive layer 20H are again etched, thereby forming step ②. The insulating layer 10H and the conductive layer 20G, which underlie the interlayer insulating layer 10I and the conductive layer 20H, are etched, thereby forming step ①, in the stack structure. Next, the width of the mask pattern 30 is reduced by the width of a contact region by etching the mask pattern 30. Here, not only the width of the mask pattern 30, but also the thickness of the mask pattern 30 is reduced.

Referring to FIG. 1D, after reducing the width of the mask pattern 30 as described above, a series of processes of etching the interlayer insulating layer 10I and the conductive layer 20H, using the reduced mask pattern 30 as an etch barrier, are repeatedly performed until the conductive layer 20A, which is the lowermost layer, is etched. As a result, the stack structure is stepwise patterned from the conductive layer 20H to the conductive layer 20A, and the same number of steps as the number of conductive layers 20A to 20H is formed in the stack structure.

The case where the conductive layers 20A to 20H of eight layers are stacked is illustrated, for example. Accordingly, the first to eighth steps ① to ⑧ may be formed.

The sides of the conductive layers 20A to 20H, which have been stepwise patterned, are defined as contact regions.

Referring to FIG. 1E, after removing the mask pattern 30, residual substances are removed through a cleaning process. Next, an insulating layer 40 is formed over the entire structure that has been stepwise patterned. A surface of the insulating layer 40 is polished. Next, contact holes, through which the respective contact regions of the conductive layers 20A to 20H, are exposed are formed. The contact holes are filled with a conductive layer, thereby forming a plurality of contact plugs 50A to 50H each coupled to a respective one the conductive layers 20A to 20H.

Conventionally, the thickness of the mask pattern 30 that is first formed must be thick enough to withstand the etch process of the mask pattern 30 that is repeatedly performed. For this reason, the thickness of the mask pattern 30 must be increased in proportion to the number of the conductive layers 20A to 20H that form the stack structure. As described above, the mask pattern 30 may be formed by performing the exposure and development processes on the photoresist layer. Accordingly, in order to increase the thickness of the mask pattern 30, the deposition thickness of the photoresist layer must be increased. If the thickness of the photoresist layer increases, there is a problem in that the time taken for the exposure process is increased. Furthermore, there are problems in that the number of processes of reducing the mask pattern 30 and the number of processes of etching the interlayer insulating layer 10I and the conductive layer 20H are increased according to the number of the conductive layers 20A to 20H that form the stack structure.

BRIEF SUMMARY

An exemplary embodiment of this disclosure relates to a nonvolatile memory device including stepped structures and a method of manufacturing the same.

A nonvolatile memory device according to an embodiment of the present invention includes a substrate including a cell region, contact regions and dummy contact regions, where the contact regions and the dummy contact regions alternately are disposed; a plurality of word lines stacked at the cell region of the substrate; contact groups stacked at the contact regions and the dummy contact regions of the substrate, where the contact groups include a plurality of pad layers being coupled to the word lines, and each of the contact groups has stepped structure disposed at a corresponding contact region.

A method of manufacturing a nonvolatile memory device according to an embodiment of the present invention includes forming stack groups on a substrate including contact regions and dummy contact regions alternately disposed, each of the stack groups comprising a plurality of stack layers, where each stack layer, of the plurality of stack layers, includes a first material layer and a second material layer; and forming stepped structures, each having a plurality of steps, where each step, of the plurality of steps, is formed using one of the plurality of stack layers, and where the stepped structures are patterned, in the contact regions, from corresponding stack groups.

BRIEF DESCRIPTION OF THE DRAWINGS

FIGS. 3A to 3G are cross-sectional views illustrating a method of manufacturing a 3-D nonvolatile memory device according to one embodiment of the present invention;

FIGS. 6A to 6E are cross-sectional views illustrating a method of manufacturing a 3-D nonvolatile memory device according to another exemplary embodiment of this disclosure.

DETAILED DESCRIPTION

Hereinafter, exemplary embodiments of the present disclosure will be described in detail with reference to the accompanying drawings. The figures are provided to allow those having ordinary skill in the art to understand the scope of the embodiments of the disclosure.

Figure 1A:
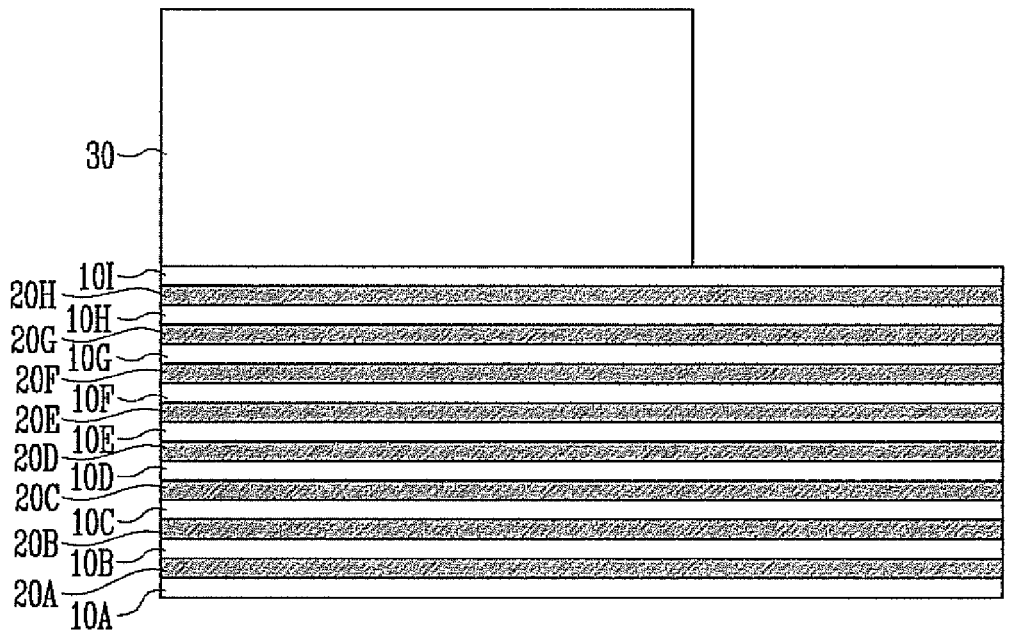
FIGS. 1A to 1E are cross-sectional views illustrating a method of manufacturing a conventional 3-D nonvolatile memory device.
Figure 1B:
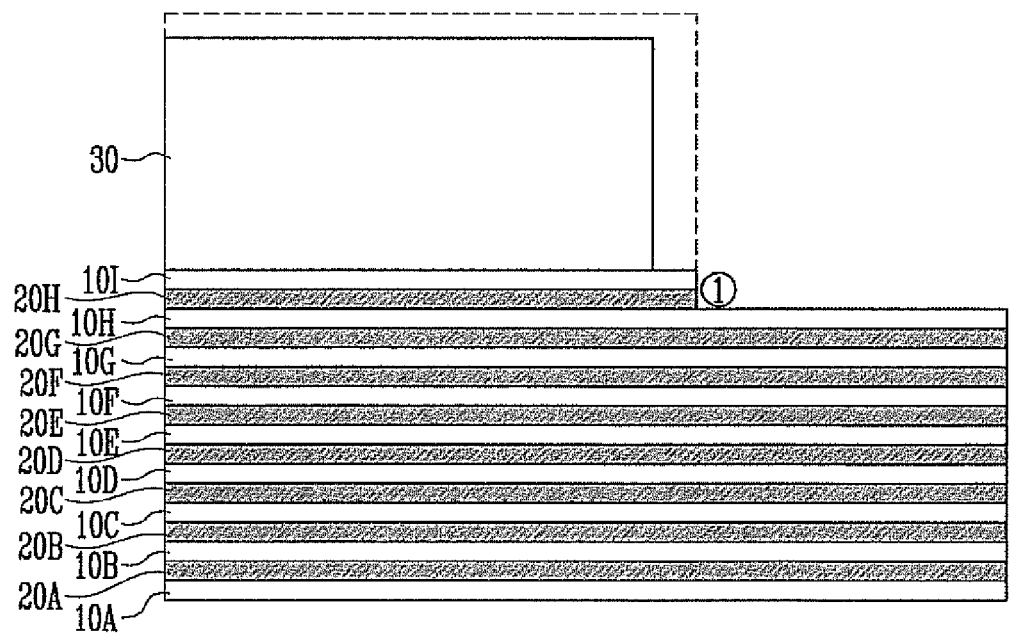
Figure 1C:
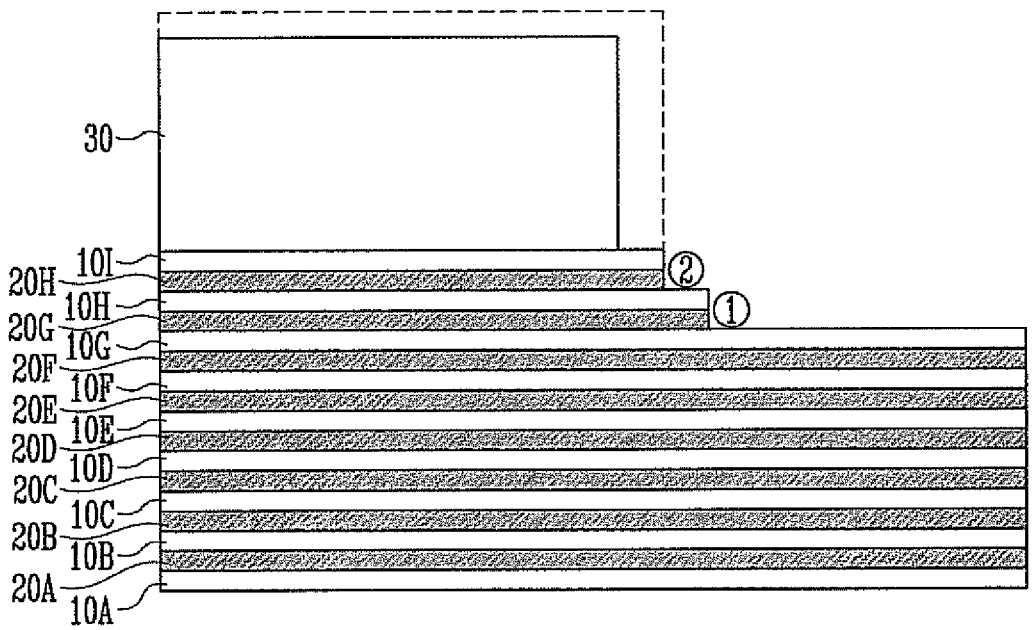
Figure 1D:
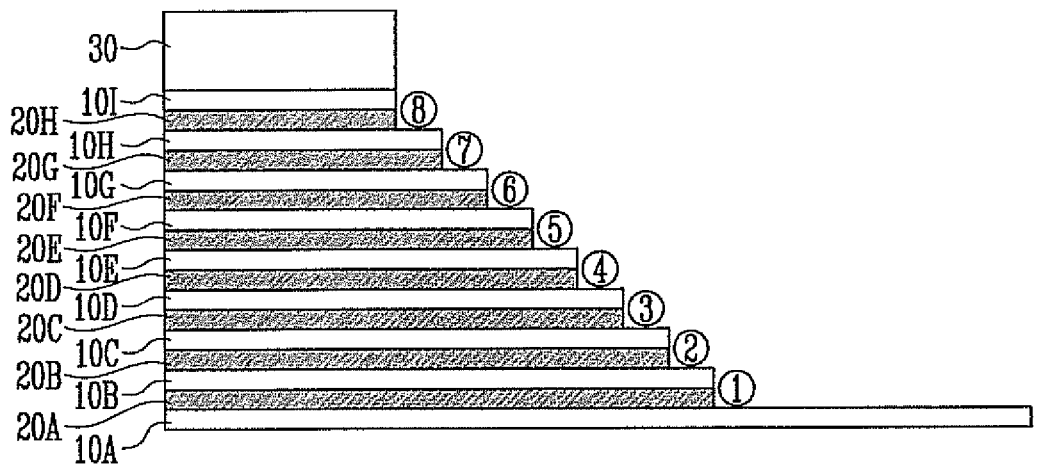
Figure 1E:
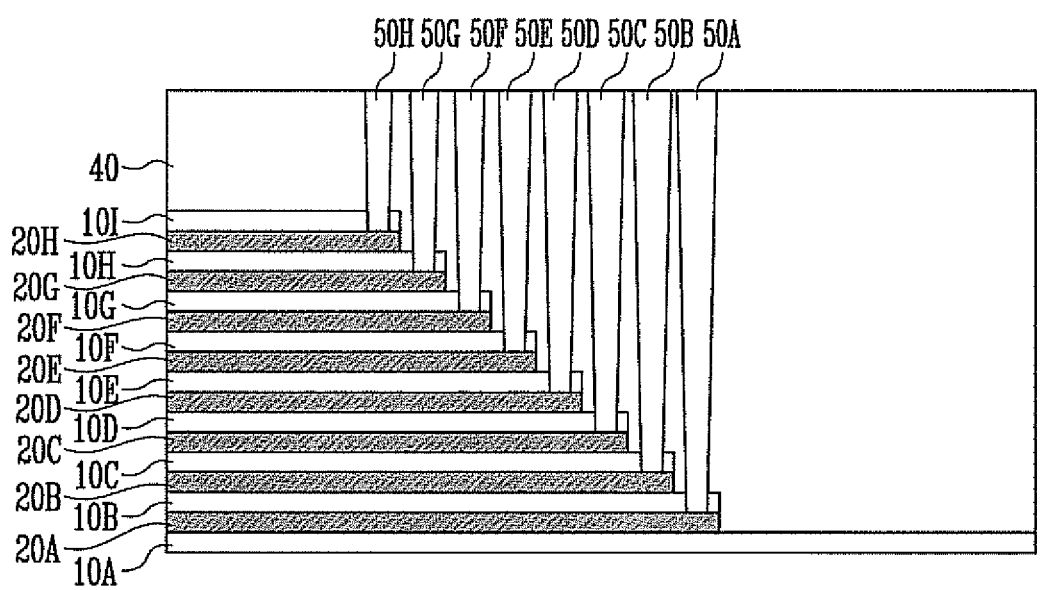
Figure 2:
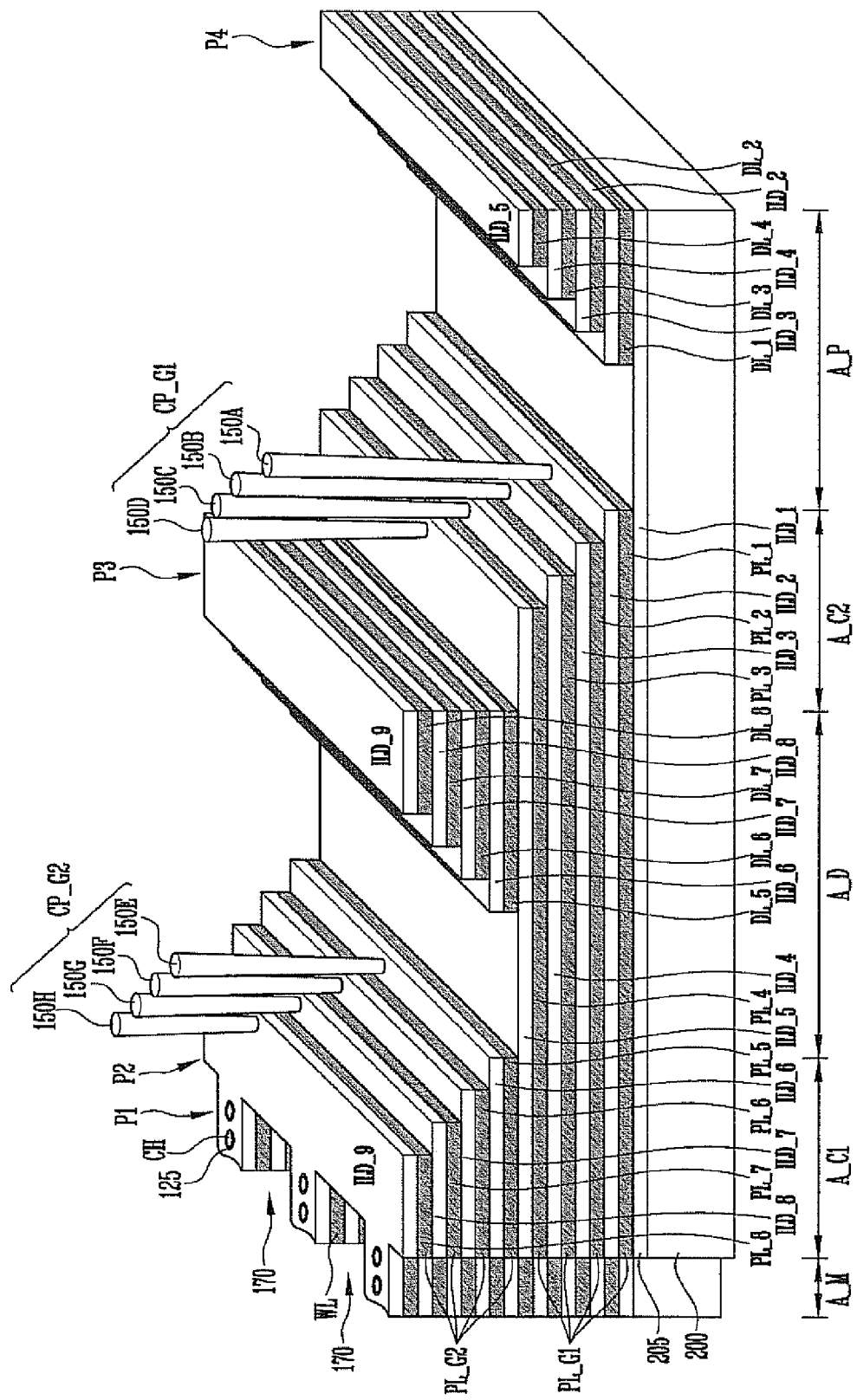
FIG. 2 is a perspective view illustrating a 3-D nonvolatile memory device according to one embodiment of the present invention.

FIG. 2 is a perspective view illustrating a 3-D nonvolatile memory device according to one embodiment of the present invention. In FIG. 2, only contact regions and part of a cell region coupled to the contact regions and part of a peripheral region are illustrated, and some of insulating layers are not shown, for convenience of description.

Referring to FIG. 2, the 3-D nonvolatile memory device according to the embodiment of the present invention includes a cell region A_M, a peripheral region A_P, two or more contact regions A_C1 and A_C2 and at least one dummy contact region A_D. The contact regions A_C1 and A_C2 and the dummy contact region A_D are alternately disposed between the cell region A_M and the peripheral region A_P. The contact regions A_C1 and A_C2 are arranged in a line on at least one side of the cell region A_M and are spaced apart from each other at a specific interval with the dummy contact region A_D interposed therebetween. The dummy contact region A_D is defined as a region between the adjacent contact regions A_C1 and A_C2. The dummy contact region A_D may have a width wider than each of the contact regions A_C1 and A_C2.

A word line structure P1, including a plurality of interlayer insulating layers ILD_1 to ILD_9 and a plurality of word lines WL, which are alternately stacked, is formed over the substrate 200 of the cell region A_M. The word line structure P1 is formed in a line in one direction and has a first width W1 (not shown). The word line structure P1 is penetrated by vertical channel layers CH, each having an outer wall surface surrounded by a memory stack layer 125. The memory stack layer 125 includes a tunnel insulating layer configured to surround the vertical channel layer CH, a charge trap layer configured to surround the tunnel insulating layer, and a charge blocking layer configured to surround the charge trap layer. Although not shown, a pair of the vertical channel layers CH may be coupled by a pipe channel layer.

The word lines WL, of the word line structure P1, are coupled to pad layers PL1 to PL8. The pad layers PL1 to PL8 are extend to at least one of the contact regions A_C1 and A_C2. The interlayer insulating layers ILD_1 to ILD_9, of the word line structure P1, are extended to at least one of the contact regions A_C1 and A_C2. The contact structure P2 includes the interlayer insulating layers ILD_1 to ILD_9 and the pad layers PL_1 to PL_8, both of which extend from the word line structure P1 to at least one of the contact regions A_C1 and A_C2, and are alternately stacked.

The pad layers PL_1 to PL_8 are coupled to the word lines WL and are divided into two or more contact groups PL_G1 and PL_G2. The number of stacked pad layers that form each of the contact groups PL_G1 and PL_G2 may be the same in the contact groups PL_G1 and PL_G2. The number of stacked contact groups PL_G1 and PL_G2 and the number of stacked pad layers forming each of the contact groups PL_G1 and PL_G2 may be determined in various ways. For example, in the present embodiment, two contact groups PL_G1 and PL_G2 are stacked over the substrate 200 and each of the contact groups PL_G1 and PL_G2 includes four-layered pad layers sequentially stacked.

The contact groups PL_G1 and PL_G2 include the pad layers PL_1 to PL_8 and the interlayer insulating layers ILD_2 to ILD_9, which are patterned to form stepped structures. More particularly, each of the contact groups PL_G1 and PL_G2 includes a plurality of stack layers, each including one of the pad layers and one of the interlayer insulating layers (for example, PL_1 and ILD_2). Furthermore, each of the contact groups PL_G1 and PL_G2 has a stepped structure using the stack layers as steps. The stepped structures of the contact groups PL_G1 and PL_G2 are disposed in the respective contact regions A_C1 and A_C2. According to one embodiment of the present invention, the stepped structures of the contact groups PL_G1 and PL_G2 may be formed the same number of alternately arranged stack layers. Furthermore, the stepped structures of the contact groups PL_G1 and PL_G2 are spaced apart from each other at a specific interval with the dummy contact region A_D interposed therebetween.

A dummy contact structure P3 may be formed in the dummy contact region A_D and a dummy contact structure P4 may be formed in the peripheral region A_P. The dummy contact structures P3 and P4 include a plurality of dummy layers DL_1 to DL_8 and the interlayer insulating layers ILD_2 to ILD_9, which are patterned to have stepped structures. More particularly, each of the dummy contact structures P3 and P4 includes a plurality of dummy stack layers, each including a dummy layer and a dummy interlayer insulating layer (for example, DL_1 and ILD_2). Furthermore, each of the dummy contact structures P3 and P4 has a stepped structure having the stack layers as steps. The stepped structures of the dummy contact structures P3 and P4 are formed so that the steps of the dummy contact structures P3 and P4 and the steps of the stepped structures of the contact groups PL_G1 and PL_G2 face each other. Moreover, stepped structures of the dummy contact structures P3 and P4 are symmetrical with the stepped structures of the contact groups PL_G1 and PL_G2. The stack layers of the dummy contact structures P3 and P4 may be formed of the same materials as the stack layers of the contact group PL_G2. Moreover, the dummy stack layers of the dummy contact structure P3 may be formed in the same layers as the contact group PL_G2 and the dummy stack layers of the dummy contact structure P4 may be formed in the same layers as the contact groups PL_G1. The dummy contact structures P3 and P4 reduce a dishing phenomenon occurring in a process of polishing an insulating layer (not shown). This is described in detail later.

In the contact region A_C1, the pad layers PL_5 to PL_8, of the contact group PL_G2, are coupled to respective contact plugs 150E to 150H. In the contact region A_C2, the pad layers PL_1 to PL_4, of the contact group PL_G1, are coupled to respective contact plugs 150A to 150D. The contact plugs 150A to 150H are separated into contact plug groups CP_G1 and CP_G2, which correspond to the respective contact groups PL_G1 and PL_G2.

Each of the pad layers PL_1 to PL_8, of the contact structure P2, and each of the dummy layers DL_1 to DL_8, of the dummy contact structure P3, may have a width that is greater than the width of the word line structure P1.

Furthermore, the contact groups PL_G1 and PL_G2 and the dummy contact structures P3 and P4 are spaced apart from each other at a specific interval.

FIGS. 3A to 3G are cross-sectional views illustrating a method of manufacturing a 3-D nonvolatile memory device according to one embodiment of the present invention. In particular, only the contact regions A_C1 and A_C2, the dummy contact region A_D, and the peripheral region A_P shown in FIG. 2 are illustrated in FIGS. 3A to 3G, for convenience of description.

Figure 3G:
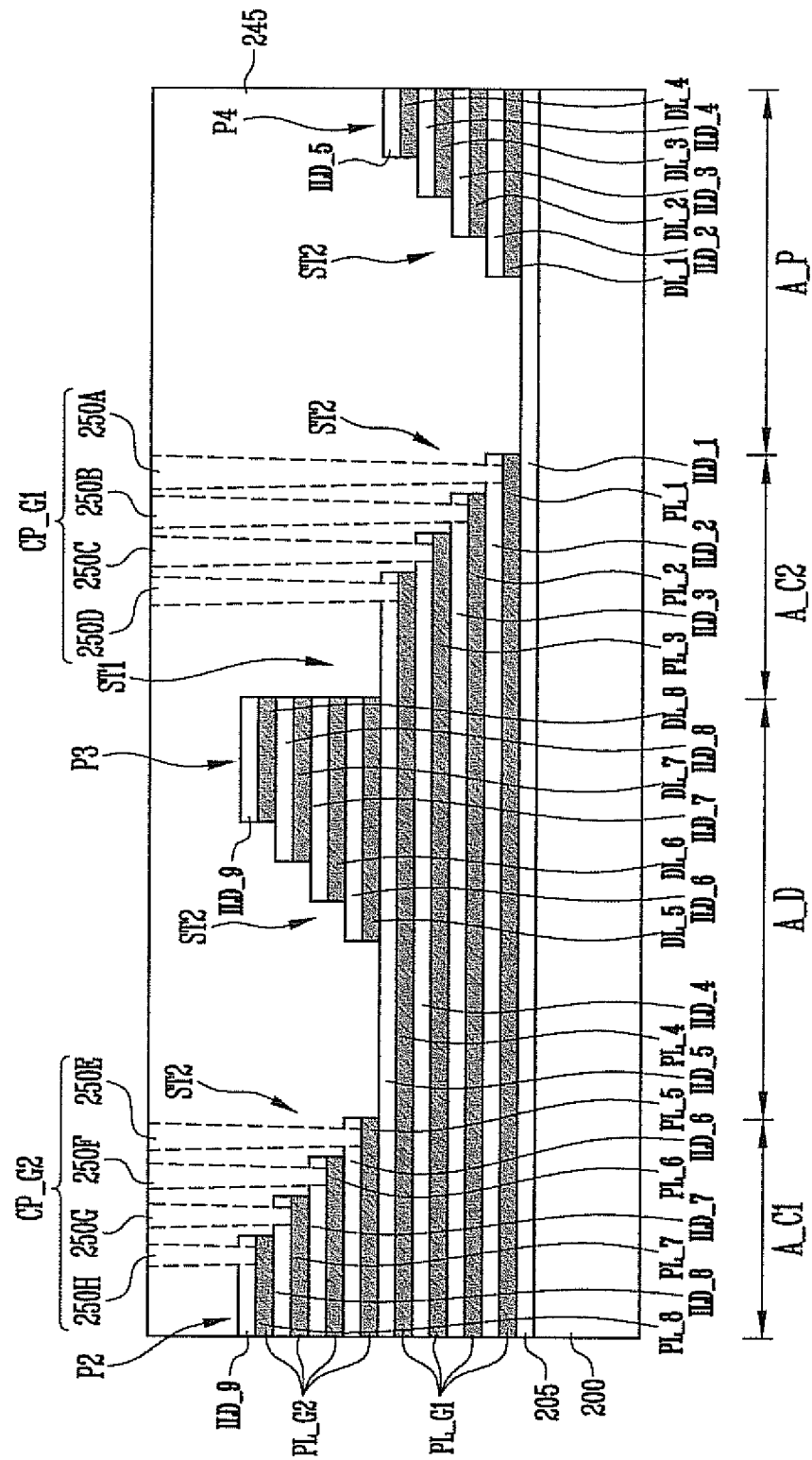

Referring to FIG. 3A, a plurality of stack groups ML1 and ML2 is formed by alternately stacking first material layers 215A to 215H and second material layers 225A to 225H over a substrate 200, in which an underlying structure is formed. Each of the stack groups ML1 and ML2 are formed of the same number of alternately arranged stack layers. Moreover, a thickness of each of the stack groups ML1 and ML2 may be substantially the same. A number of stack groups ML1 and ML2 and a number of first and second material layers that form each of the stack groups ML1 and ML2 may vary. For example, FIGS. 3A to 3G illustrate two stack groups ML1 and ML2, each having four stack layers. That is four first material layers and four second material layers.

The substrate 200 includes a cell region A_M (shown in FIG. 2), a peripheral region A_P, contact regions A_C1 and A_C2 and the dummy contact region A_D. The contact regions A_C1 and A_C2 and the dummy contact region A_D that are disposed in a line between the cell region A_M and the peripheral region A_P. The dummy contact region A_D is disposed between the contact regions A_C1 and A_C2.

Although not shown, the underlying structure includes a source line or a pipe gate. Furthermore, an interlayer insulating layer 205 may be further formed between the stack group ML1, which is the lowermost stack group, and the substrate 200, thus providing insulation between the underlying structure and a conductive layer formed over the underlying structure. The interlayer insulating layer 205 may be formed of an oxide layer.

The first material layers 215A to 215H are formed in regions where pad layers and dummy layers will be formed. Each of the first material layers 215A to 215H may be formed of a conductive layer or a sacrificial layer. The second material layers 225A to 225H are formed in regions where interlayer insulating layers, which provide insulation between the pad layers, between the dummy layers, between the pad layers and a structure to be formed on the pad layers, or between the dummy layers and a structure to be formed on the dummy layers. Each of the second material layers 225A to 225H may be an interlayer insulating layer or a sacrificial layer. For example, if the first material layers 215A to 215H are conductive layers, then the second material layers 225A to 225H may be sacrificial layers or interlayer insulating layers. If the first material layers 215A to 215H are sacrificial layers, then the second material layers 225A to 225H may be interlayer insulating layers. If the first material layers 215A to 215H are conductive layers, then the first material layers 215A to 215H may be made of polysilicon. In particular, if the first material layers 215A to 215H are formed of doped polysilicon layers, then the second material layers 225A to 225H may be sacrificial layers formed of undoped polysilicon. If the first material layers 215A to 215H are sacrificial layers, then the second material layers 225A to 225H may be formed of a nitride. The interlayer insulating layer may be formed of an oxide layer. The number of first material layers 215A to 215H is determined by the number of memory cells to be stacked.

Although not shown, after forming the stack groups ML1 and ML2, processes of forming vertical channel layers and memory stack layers may be performed. In order to form the vertical channel layers and the memory stack layers, first, holes are formed by etching the stack groups ML1 and ML2 and the interlayer insulating layer 205. The holes penetrate the stack groups ML1 and ML2 and the interlayer insulating layer 205. A charge blocking layer, a charge trap layer, and a tunnel insulating layer are sequentially formed over the inner walls of the holes. Vertical channel layers are formed in the respective holes in each of which the tunnel insulating layers is formed. Each of the vertical channel layers may be formed to fully fill the hole or may be formed so that each of the vertical channel layers is hollow and has a tube form. If the vertical channel layer has the tube form, the inside of the tube, defined by the vertical channel layer, may be filled with an insulating material. Thus, a plurality of memory cells may be stacked along the vertical channel layer. Corresponding pairs of the vertical channel layers may be coupled by a pipe channel filled within a pipe gate.

Referring to FIG. 3B, a mask pattern 230 is formed over the stack groups ML1 and ML2. The mask pattern 230 may be formed by depositing a photoresist layer and performing a photolithography process of exposing and developing the photoresist layer. The mask pattern 230 is formed so that an end of the contact region A_C2 that is adjacent to the peripheral region A_P is exposed. More specifically, the mask pattern 230 is formed to expose the contact region A_C2 of the stack group ML1, which is the lowermost stack group. Thus, the mask pattern 230 includes an edge disposed at a boundary of the dummy contact region A_D and the contact region A_C2 that is adjacent to the peripheral region A_P.

Next, the stack group ML2, which is the uppermost stack group, is etched using the mask pattern 230 as an etch barrier. As a result, first stepped structure ST1 is formed. The stack groups ML1 and ML2 form steps of the first stepped structure ST1.

The mask pattern 230 has a sufficient thickness so that a plurality of the stack layers, which are stacked to form each of the stack groups ML1 and ML2, may be etched in a single etch process. Accordingly, in one embodiment of the present invention, the thickness of the mask pattern 230 may be reduced, as compared with a conventional technique, where an etch process is repeated for each of the stack layers that form the stack groups ML1 and ML2. Furthermore, the thickness of the photoresist layer for forming the mask pattern 230 may be reduced, and the time taken to perform the photolithography process may be reduced.

Referring to FIG. 3C, the mask pattern 230 is removed and a cleaning process, for removing residual substances, is then performed. Next, a mask pattern 240A is formed on the entire structure in which the first stepped structure ST1 is formed. The mask pattern 240A may be formed by depositing a photoresist layer and performing a photolithography process for exposing and developing the photoresist layer. The photoresist layer for the mask pattern 240A may be conformally formed, so that the photoresist layer conforms to the step of the first stepped structure ST1. The mask pattern 240A covers part of the dummy contact region A_D and the contact regions A_C1 and A_C2. In particular, the mask pattern 240A shields some regions of the dummy contact region A_D where dummy contact structures will be formed. The mask pattern 240A is used to form second stepped structures in the stack groups ML1 and ML2. Each of the second stepped structures includes the stack layers, each of which includes one of the first and the second material layers. Each of the second stepped structures ST2 (as shown in FIG. 3F) includes a step formed of a stack layer, which includes a first material layer and a second material layer (e.g., 215H and 225H). The mask pattern 240A is used to expose regions where the lowermost stack layers, which are formed of the lowermost first and second material layers 215A, 225A and 215E, 225E, will be etched. A portion of the mask pattern 240A that covers the dummy contact region A_D may have a same width (W_B) as a width (W_A) of a portion of the mask pattern 240A that covers the contact region A_C2.

The mask pattern 240A is formed to a sufficient thickness to function as an etch barrier in a subsequent process of patterning the stack groups ML1 and ML2 via a series of etch processes to form the second stepped structures ST2. The thickness of the mask pattern 240A is determined based on an amount of thickness that is lost during each etch process.

Referring to FIG. 3D, the stack groups ML1 and ML2 are etched, using the mask pattern 240A as an etch barrier, to form steps having a thickness that is substantially equal to the thickness of the uppermost stack layers. That is, the first and the second material layers 215D, 225D and 215H, 225H, which form the uppermost stack layers of the respective stack groups ML1 and ML2, are etched using the mask pattern 240A as an etch barrier. The etch process also reduces the thickness of the mask pattern 240A. Thus, part of the top surfaces of the first and the second material layers 215D, 225D and 215H and 225H are exposed through the etched mask pattern 240B.

Referring to FIG. 3E, the exposed regions of the stack groups ML1 and ML2 are etched. Therefore the upper two of the stack layers of each of the stack groups ML1 and ML2 are etched.

Next, the mask pattern 240B is reduced by etching. Thus, part of the top surfaces of the first and the second material layers 215D, 225D, 215C, 225C, 215H, 225H, 215G, and 225G are exposed through the reduced mask pattern 240C.

Referring to FIG. 3F, the exposed regions of the stack groups ML1 and ML2 are etched using the reduced mask pattern 240C as an etch barrier. Therefore the all of the stack layers of each of the stack groups ML1 and ML2 are etched.

A process S1 of reducing the mask pattern and a process S2 of etching, using the reduced mask pattern as an etch barrier, the exposed regions of the stack groups ML1 and ML2 are repeatedly performed until the second stepped structures ST2 are formed in the stack groups ML1 and ML2. That is, the processes S1 and S2 are repeatedly performed until the first and the second material layers 215A, 225A and 215E, 225E, which are the lowermost layers of respective stack groups ML1 and ML2, are exposed to form steps.

As shown in FIG. 3F, the stack groups ML1 and ML2 are divided into pad stack groups ML1A and ML2A and dummy stack groups ML1B and ML2B, each of which has a portion that defines the second step structure ST2. Here, the pad stack groups ML1A and ML2A are formed from the same layers and the dummy stack groups ML1B and ML2B are formed from the same layers. Moreover, the pad stack groups ML1A and ML2A and the dummy stack groups ML1B and ML2B are formed to be symmetrical to one another. Furthermore, the steps of the stepped structure of the pad stack group ML1A are arranged to face the steps of the dummy stack group ML1B and the steps of the stepped structure of the pad stack group ML2A are arranged to face the steps of stepped structure of the dummy stack group ML2B.

The mask pattern 240D, which is used as an etch barrier when etching the first and the second material layers 215A, 225A and 215E, 225E of the respective stack groups ML1 and ML2, is formed to a sufficient thickness to allow to the mask pattern 240D to functions as an etch barrier during a series of etch processes. Thus, an initial thickness of the mask pattern 240A, and the final thickness of the mask pattern 240D, are determined based on the amount of thickness that is lost during each etch process and the number of etch processes necessary to form the second step structures ST2.

In accordance with one embodiment of the present invention, after the first stepped structure ST1, including the stack groups ML1 and ML2, is formed, the second stepped structures ST2 are simultaneously formed in the stack groups ML1 and ML2. In accordance with one embodiment of the present invention, as described above, the stack layers are etched for each stack group, and the stepped structures of the stack groups are simultaneously formed. In this case, the width of the stack layers, exposed through the stepped structures may be uniform. In contrast, in a conventional process, the stepped structures are formed by repetitively etching the uppermost layer to the lowermost layer of the stack layers, while reducing the width of one mask pattern. Furthermore, in one exemplary embodiment, the number of etch processes of mask pattern and the number of processes of the stack layers may be reduced. In contrast, in a conventional process, the stepped structures are formed by repetitively etching the uppermost layer to the lowermost layer of the stack layers, while reducing the width of one mask pattern.

In an exemplary embodiment of the present invention, a number of etch processes needed to form the stepped structure is reduced as compared to a conventional method. For example, an embodiment in which the stepped structures have eight steps formed in the stack groups will be described below.

For example, if using conventional processing, forming stepped structures of eight steps, while reducing the width of one mask pattern, requires sixteen separate processes: one process for forming the mask pattern, seven processes of reducing the mask pattern, and eight etch processes must be performed. In contrast, in accordance with one embodiment of the present invention, only nine processes need to be performed: two processes of forming the mask pattern, three processes of reducing the mask pattern, and four etch processes. When the number of processes needed to reduce the mask pattern is decreased, the thickness of the photoresist layer may be decreased and the time taken for the photolithography process may be also be decreased.

Referring to FIG. 3G, after removing the mask pattern 240D and performing a cleaning process for removing residual substances, a subsequent and predetermined process is performed. The subsequent process may vary depending on the compositions of the first material layers 215A to 215H and the second material layers 225A to 225H.

If the first material layers 215A to 215H are formed of conductive layers and the second material layers 225A to 225H are formed of interlayer insulating layers, the following process is performed. First, for each memory block or for each word line, slits 170(shown in FIG. 2) for dividing the entire structure, including the pad stack groups ML1A and ML2A and the dummy stack groups ML1B and ML2B in which the second stepped structures ST2 are formed. Thus, the pad layers PL1 to PL8, the interlayer insulating layers ILD1 to ILD9, and the dummy layers DL1 to DL8 are formed.

Figure 4A:
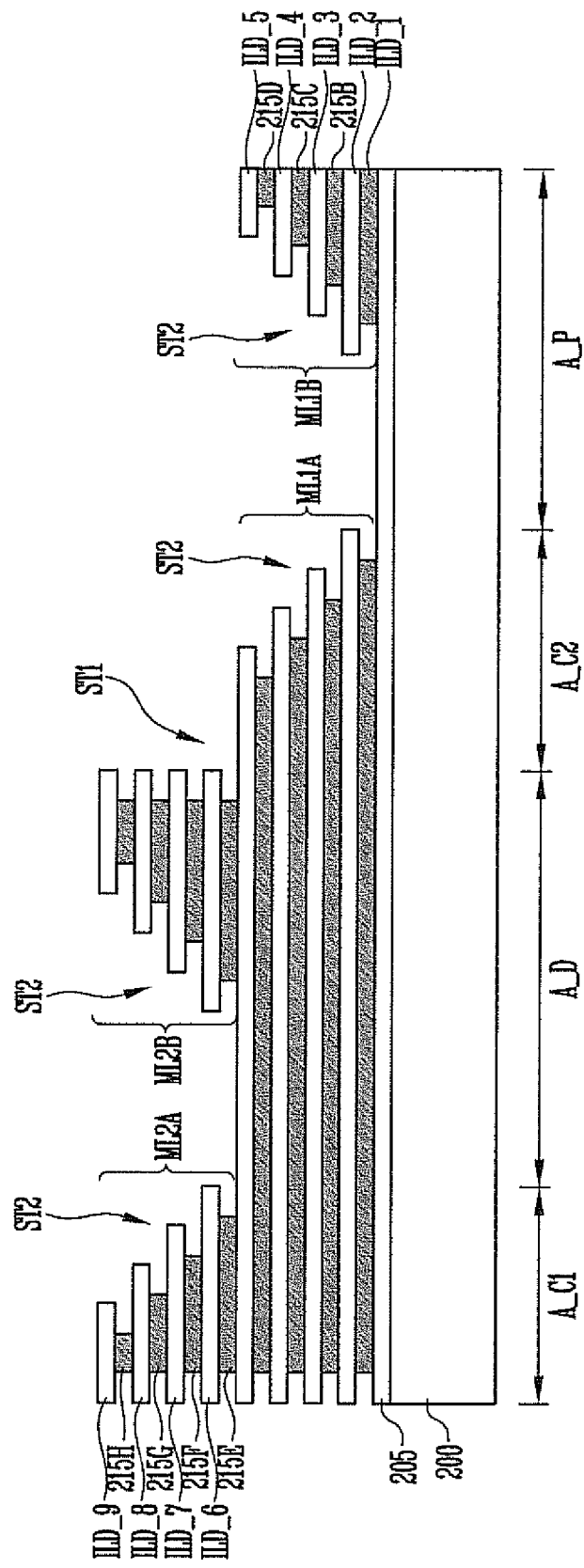
FIGS. 4A and 4B are cross-sectional views illustrating a method of manufacturing a 3-D nonvolatile memory device according to another embodiment of the present invention.
Figure 4B:
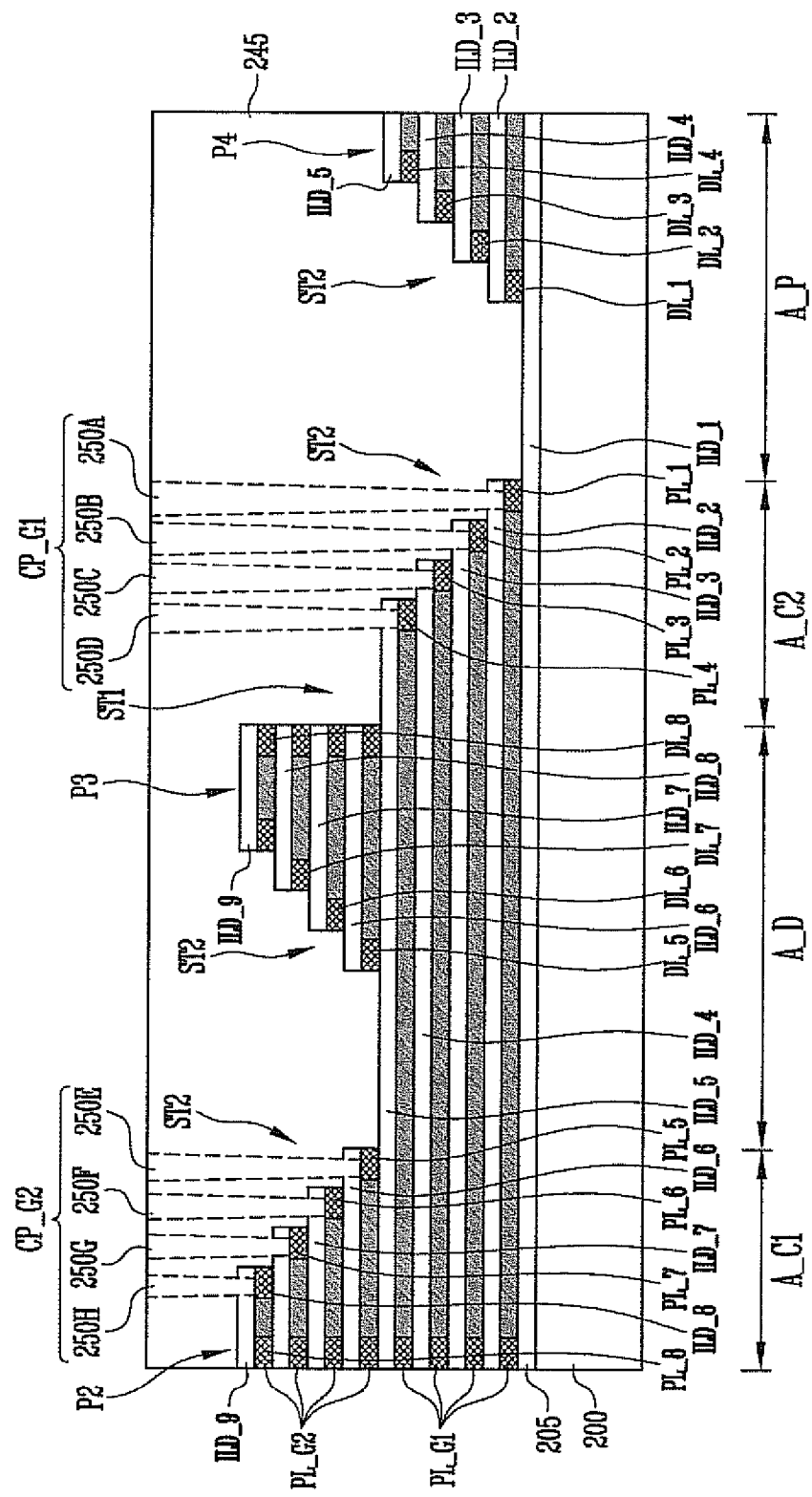

FIGS. 4A and 4B are cross-sectional views illustrating a method of manufacturing a 3-D nonvolatile memory device according to another embodiment of the present invention.

Referring to FIG. 4A, if the first material layers 215A to 215H are formed of sacrificial layers and the second material layers 225A to 225H are formed of interlayer insulating layers, the following process is performed. First, slits 170(shown in FIG. 2) are formed as described above. Then, the first and the second material layers 215A to 215H and 225A to 225H are patterned. Thus, the interlayer insulating layers ILD1 to ILD9 are formed.

Next, portions of the first material layers 215A to 215H that are exposed by the slits 170 are removed. The process of removing the portions of first material layers 215A to 215H is performed so that the portions of first material layers 215A to 215H of the cell region A_M shown in FIG. 2 may be fully removed. If the first material layers 215A to 215H are formed of nitride layers, then the portions of first material layers 215A to 215H may be selectively removed using phosphoric acid. If the width of the first material layers 215A to 215H, patterned in the contact regions A_C1 and A_C2, the dummy contact region A_D, and the peripheral region A_P, is wider than the width of the first material layers 215A to 215H, patterned in the cell region A_M, then the removal process of the portions of first material layers 215A to 215H, in the cell region A_M, may be performed so that the first material layers 215A to 215H, which are sacrificial layers, will remain at the central parts of the pad stack groups ML1A and ML2A and the dummy stack groups ML1B and ML2B. The first material layers 215A to 215H, remaining in the contact regions A_C1 and A_C2, the dummy contact region A_D, and the peripheral region A_P, may function to support the interlayer insulating layers ILD2 to ILD9 of the contact regions A_C1 and A_C2, the dummy contact region A_D, and the peripheral region A_P.

Referring to FIG. 4B, after removing the portions of first material layers 215A to 215H, the regions from which the first material layers 215A to 215H have been removed are filled with a conductive layer. The conductive layer may be formed of any one of a polysilicon layer, a metal layer, or a stack layer of a barrier layer and a metal layer. Thus, the pad layers PL1 to PL8 and the dummy layers DL1 to DL8 are formed.

An another exemplary embodiment, if the first material layers 215A to 215H are formed of conductive layers and the second material layers 225A to 225H are formed of sacrificial layers, the following process is performed. First, slits 170 are formed as described above, and the first and the second material layers 215A to 215H and 225A to 225H are patterned. Thus, the pad layers PL1 to PL8, and the dummy layers DL1 to DL8 are formed.

Portions of the second material layers 225A to 225H that are exposed to the slits 170 are selectively removed by an etch process. After removing the portions of the second material layers 225A to 225H, the regions from which the portions of second material layers 225A to 225H have been removed are filled with the interlayer insulating layers ILD_2 to ILD_9. The interlayer insulating layers ILD_2 to ILD_9 may be formed of oxide layers.

The pad layers PL_1 to PL_8, formed as described above, are divided into the contact groups PL_G1 and PL_G2, as discussed, for example, above with respect to FIG. 3G and FIG. 4B. The pad layers PL_1 to PL_4 and PL_5 to PL_8, which form contact groups PL_G1 and PL_G2, respectively, are stacked so that the second stepped structures ST2 form a contact structure P2 and dummy contact structures P3 and P4. The steps of the dummy contact structure P3 are formed to face the steps of the contact group PL_G1, in contact structure P2. The steps of the dummy contact structure P4 are formed to face the steps of the contact groups PL_G1 and PL_G2, in contact structure P2. Furthermore, as shown in FIG. 3G and FIG. 4B, for example, the dummy contact structure P3 may be formed in the same layers as the contact group PL_G2 and the dummy contact structure P4 may be formed in the same layers as the contact groups PL_G 1.

After forming the pad layers PL_1 to PL_8, a subsequent process is performed. If the pad layers PL_1 to PL_8 are formed of polysilicon layers, then a metal silicide layer may be formed, by a conventional process, using the polysilicon layers exposed by the slits 170. In this case, resistance of the pad layers PL_1 to PL_8 may be lowered.

An insulating layer 245 is formed over the entire structure in which the slits 170 are formed, and a surface of the insulating layer 245 is polished. If the dummy contact structures P3 and P4 are not formed under the insulating layer 245, a dishing phenomenon, in which the insulating layer 245 in the dummy contact region A_D and the peripheral region A_P become, concave may occur. In accordance with one embodiment of the present invention, since the dummy contact structures P3 and P4 remain in the dummy contact region A_D and the peripheral region A_P, respectively, the dishing phenomenon of the insulating layer 245 may be reduced in the process of polishing the surface of the insulating layer 245.

Next, contact holes, through which the pad layers PL_1 to PL_8 are exposed in the contact regions A_C1 and A_C2, are formed by an etch process. Contact plugs 250A to 250H coupled to the respective pad layers PL_1 to PL_8 are formed by filling the contact holes with a conductive layer. In FIG. 3G and FIG. 4B, regions having the contact plugs 250A to 250H formed are indicated by dotted lines.

Figure 5A:
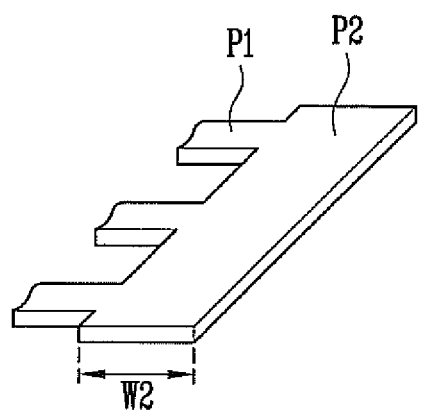
FIGS. 5A and 5B are diagrams showing various forms of contact structures according to some exemplary embodiments of this disclosure.
Figure 5B:
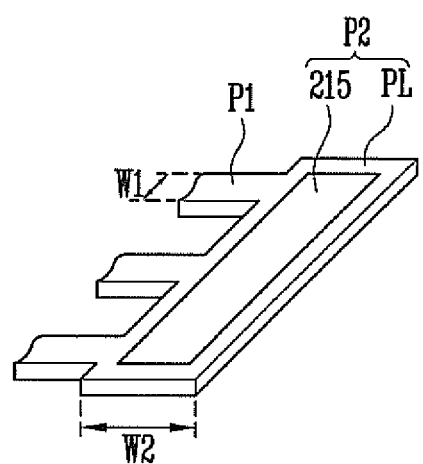

FIGS. 5A and 5B are diagrams showing various forms of contact structures according to some exemplary embodiments of the present invention.

As shown in FIGS. 2 and 5A, if the first material layers 215A to 215H are formed of conductive layers, then the same first material layers 215A to 215H may form conductive layers in the word line structure P1 and the pad layers in contact structure P2.

Alternatively, as shown in FIGS. 4B and 5B, if the first material layers 215A to 215H are formed of sacrificial layers, then the contact structure P2 includes the sacrificial layer 215 that remains, after etching, at the center of the contact structure P2 and includes the pad layers PL that surround the sacrificial layer 215. The width W2 of the contact structure P2 is wider than the width W1 of the word line structure P1.

FIGS. 6A to 6E are cross-sectional views illustrating a method of manufacturing a 3-D nonvolatile memory device according to another exemplary embodiment of the present invention. In particular, FIGS. 6A to 6E illustrate only contact regions A_C1 to A_C4, dummy contact regions A_D1 to A_D3, and a peripheral region A_P, for convenience of description. The 3-D nonvolatile memory device shown in FIGS. 5A to 5E includes pad layers larger than the pad layers of the 3-D nonvolatile memory device shown in FIG. 2. The cell region (not shown) has the same construction as the cell region of FIG. 2 except for the number of stacked memory cells.

Referring to FIG. 6A, the 3-D nonvolatile memory device, according to another exemplary embodiment of the present invention, includes the contact regions A_C1 to A_C4 and the dummy contact regions A_D1 to A_D3, which are alternately arranged in a line between a cell region (not shown) and the peripheral region A_P. The contact regions A_C1 to A_C4 are arranged on at least one side of the cell region and are spaced apart from one another at specific intervals. Each of the dummy contact regions A_D1 to A_D3 is formed in a region between the adjacent contact regions A_C1 to A_C4. The width of each of the dummy contact regions A_D1 to A_D may be wider than that of each of the contact regions A_C1 to A_C4.

Stack groups ML1 to ML4 are sequentially formed by alternately stacking a plurality of first material layers 315A to 315P and a plurality of second material layers 325A to 325P over a substrate 300, which includes the cell region, the contact regions A_C1 to A_C4, the dummy contact regions A_D1 to A_D3, and the peripheral region A_P. Although not shown, the substrate 300 may have an underlying structure formed therein. Each of the stack groups ML1 to ML4 includes a plurality of stack layers, and each of the stack layers includes a first and a second material layer that are alternately stacked.

Although not shown, the underlying structure may include a source line or a pipe gate. An interlayer insulating layer 305 may be formed between the stack group ML1, which is the lowest positioned stack group, and the substrate 300 to insulate the underlying structure from a conductive layer formed over the underlying structure. The interlayer insulating layer 305 may be formed of an oxide layer.

The number of first and second material layers that form each of the stack groups ML1 to ML4 is the same in all of the stack groups, and the stack groups ML1 to ML4 have the same thickness. The number of stack groups ML1 to ML4 may be determined in various ways. The number of first and second material layers that form each of the stack groups ML1 to ML4 may be limited by a maximum deposition thickness of a mask pattern that is used to form first stepped structure and second stepped structures.

The first material layers 315A to 315P are formed in regions where pad layers and dummy layers will be formed and may be conductive layers or sacrificial layers. The second material layers 325A to 325P are formed in regions where interlayer insulating layers, each providing insulation between the pad layers, between the dummy layers, between the pad layer and the dummy layer, or between structures formed over the pad layer and the dummy layer, will be formed. The second material layers 325A to 325P may be interlayer insulating layers or sacrificial layers. The first material layers 315A to 315P and the second material layers 325A to 325P have been described in detail with reference to FIG. 3A, and thus, a further description is omitted.

Although not shown, after forming the multi-layered stack groups ML1 to ML4, a process of forming vertical channel layers and memory stack layers may be performed as described above with reference to FIG. 3A. A pair of the vertical channel layers may be coupled by a pipe channel filled within a pipe gate.

A mask pattern 330A is formed on the stack groups ML1 to ML4. The mask pattern 330A may be formed by depositing a photoresist layer and performing a photolithography process of exposing and developing the photoresist layer. The mask pattern 330A is used in an etch process that etches stack groups ML2 to ML4 to expose the contact region A_C4 of the stack group ML1, which is the lowermost stack group. The mask pattern 330A includes an edge disposed at the boundary of the dummy contact region A_D3 and the contact region A_C4, which is adjacent to the peripheral region A_P.

A first stepped structure is formed by patterning the stack groups ML1 to ML4 during a series of etch processes. The mask pattern 330A has a thickness sufficient to allow the mask pattern 330A to function as an etch barrier during the series of etch processes that form the first stepped structure. The initial thickness of the mask pattern 330A is based on a thickness that will be lost in each of the series of etch processes.

Figure 6B:
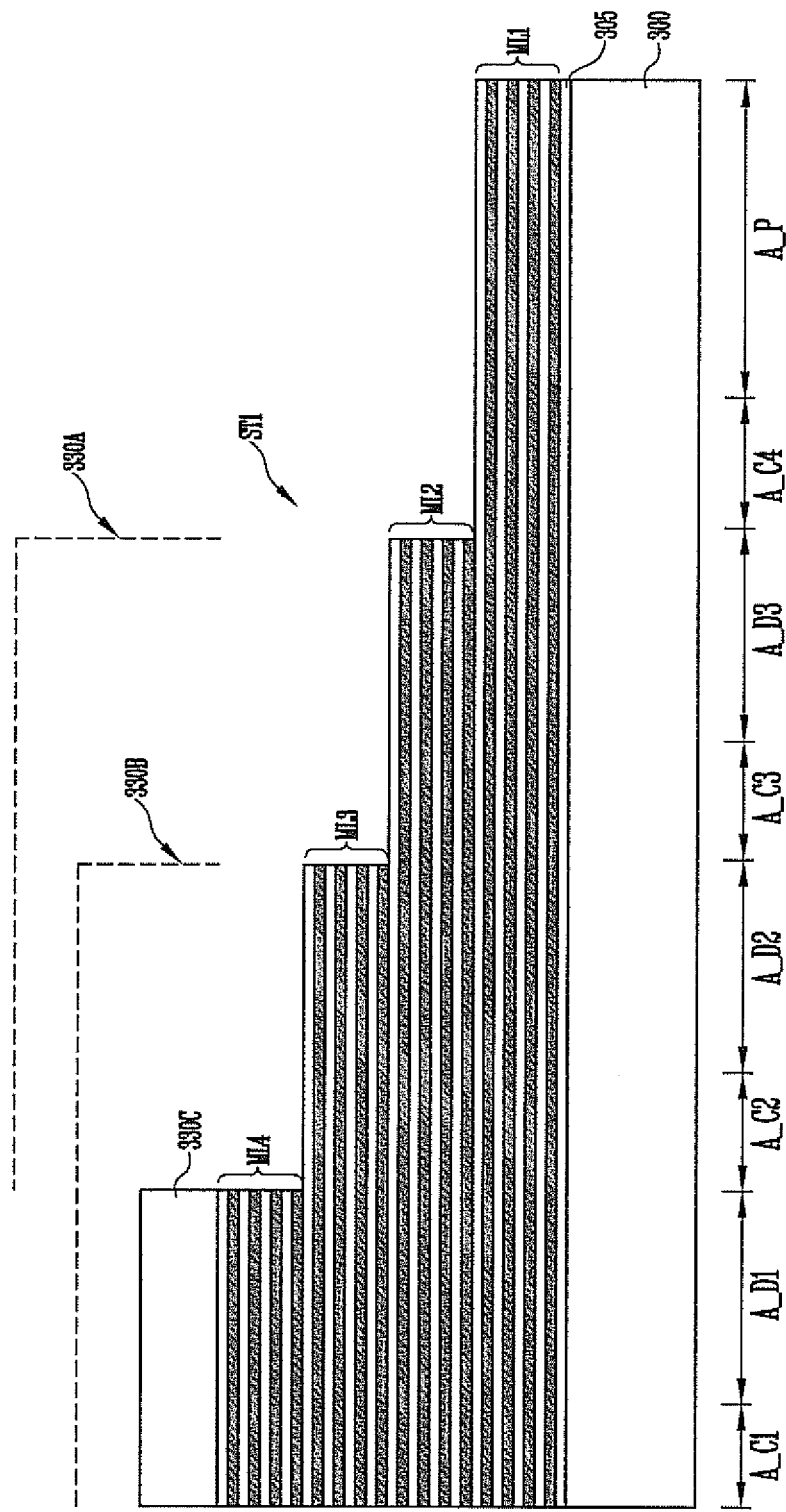

Referring to FIG. 6B, the stack group ML4, which is the uppermost stack group, is etched using the mask pattern 330A as an etch barrier. Next, a process of reducing the mask pattern 330A by a series of etch processes until the stack group ML1, which is the lowermost stack group, is exposed and a series of etch processes of the exposed regions of the stack groups ML2 to ML4, using the reduced mask patterns 330B and 330C as an etch barrier, are performed. Here, a thickness etched in each of the etch processes is equal to the thickness of each of the stack groups ML2 to ML4. As a result, first stepped structure ST1 is formed. The stack groups ML1 to ML4 form the steps of each of the first stepped structure ST1.

Figure 6C:
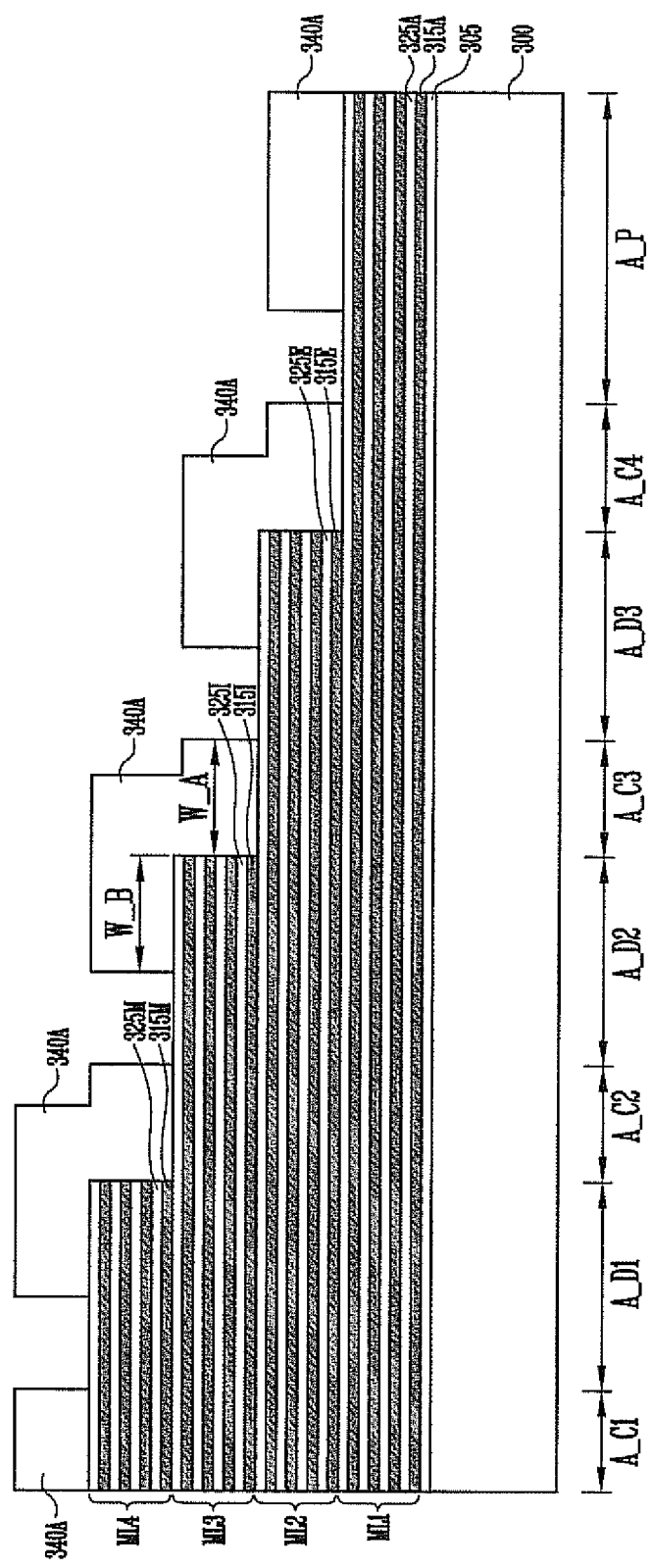

Referring to FIG. 6C, the mask pattern 330C is removed, and a cleaning process for removing residual substances is then performed. Next, a mask pattern 340A is formed over the entire structure in which the first stepped structure ST1 is formed. The mask pattern 340A may be formed by depositing a photoresist layer and performing a photolithography process of exposing and developing the photoresist layer. The photoresist layer for the mask pattern 340A may conform to the steps of the first stepped structure ST1. The mask pattern 340A is used to form the second stepped structures in the respective stack groups ML1 to ML4. Each of the steps of each of the second stepped structures includes a stack layer that includes the sequentially stacked first and the second material layers. The mask pattern 340A is formed to expose regions where the stack layers 315A, 325A, 315E, 325E, 315I, 325I, 315M, and 325M, which are the lowermost stack layers of the respective stack groups ML1 to ML4, will be etched. The mask pattern 340A is formed to cover part of each of the dummy contact regions A_D1 to A_D3 and to completely cover the contact regions A_C1 to A_C4. In particular, the mask pattern 340A is formed to cover regions of the dummy contact regions A_D1 to A_D3 where dummy contact structures will be formed. As discussed above, the mask pattern 340A may completely cover each of the contact regions A_C1 to A_C4 and may cover part of each of the dummy contact regions A_D1 to A_D3. A width W_A of a portion of the mask layer pattern 340A that covers each of the contact regions A_C1 to A_C4 is the same as a width W_B of a portion of the layer pattern 340A that covers part of each of the dummy contact regions A_D1 to A_D3.

The mask pattern 340A has a thickness sufficient to allow the mask pattern 340A to function as an etch barrier during a series of etch processes that form the second stepped structures. The thickness of the mask pattern 340A is determined based on a thickness that will be lost in each of the series of etch processes needed to form the second stepped structures.

Figure 6D:
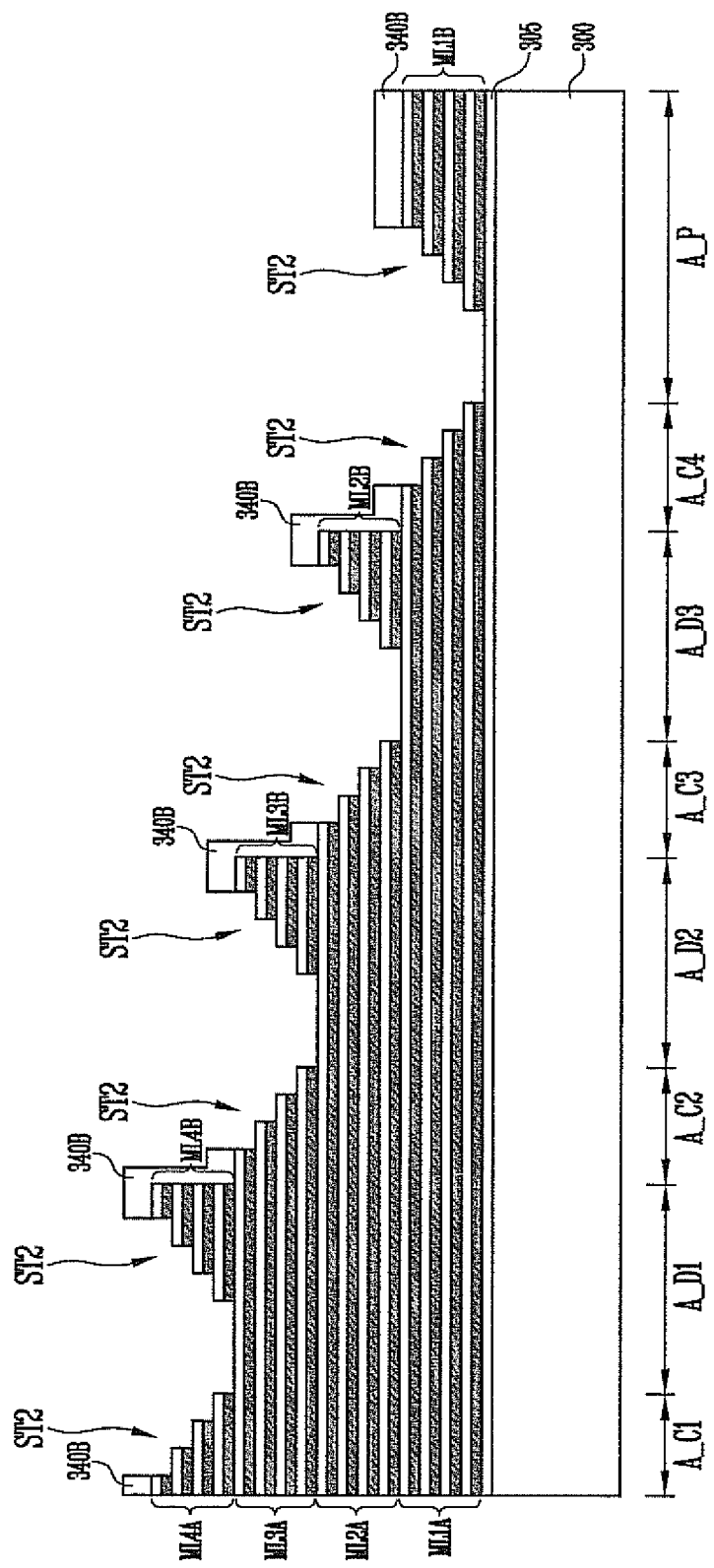

Referring to FIG. 6D, using the mask pattern 340A as an etch barrier, the stack groups ML1 to ML4 are etched to a thickness equal to the thickness of each of the stack layers that form the steps of the second stepped structures. That is, the first and the second material layers 315D, 325D, 315H, 325H, 315L, 325L, 315P, and 325P formed at the uppermost stack layers of the respective stack groups ML1 to ML4 are etched using the mask pattern 340A as an etch barrier.

Next, the mask pattern 340A is reduced by etching. Thus, part of the top surfaces of the first and the second material layers 315D, 325D, 315H, 325H, 315L, 325L, 315P, and 325P are exposed by the reduced mask pattern 340A. The exposed regions of the stack groups ML1 to ML4 are etched to a thickness equal to the thickness of the one stack layer using the reduced mask pattern as an etch barrier.

A process S1 of reducing the mask pattern and a process S2 of etching, using the reduced mask pattern as an etch barrier, the exposed regions of the stack groups ML1 to ML4 are repeatedly performed until the first and the second material layers 315A, 325A, 315E, 325E, 315I, 325I, 315M, and 325M, which are the lowermost layers of respective stack groups ML1 to ML4 are exposed to form steps. As a result, the stack groups ML1 to ML4 are separated into respective pad stack groups ML1A to ML4A and respective dummy stack groups ML1B to ML4B. Pad stack groups ML1A to ML4A and dummy stack groups ML1B to ML4B each have a portion that defines the second step structures ST2. Here, the pad stack groups ML1A to ML4A are formed from the same layers and the dummy stack groups ML1B to ML4B are formed from the same layers. Moreover, the pad stack groups ML1A to ML4A and the dummy stack groups ML1B to ML4B are symmetrical. Furthermore, the steps of the stepped structure of the pad stack group ML1A-ML4A are arranged to face the steps of the dummy stack group ML1B-ML4B, respectively.

The mask pattern 340B, which is used as an etch barrier when etching the first and the second material layers 315A, 325A, 315E, 325E, 315I, 325I, 315M, and 325M, which are formed at the lowermost stack layers of the respective stack groups ML1 to ML4, is formed to a sufficient thickness to allow the mask pattern 340B to function as an etch barrier during a series of etch processes. Thus, an initial thickness of the mask pattern 340A, and a final thickness of the mask pattern 340D, are determined based on the amount of thickness that is lost during each etch process and the number of etch processes necessary to form the second step structures ST2.

In accordance with this embodiment of the present invention, the stack layers are separated into the stack groups, and the stepped structures of the stack groups are formed at the same time. Thus, the width of the stack layers exposed through the stepped structure may be uniformly formed, as compared with the case where stepped structures ranging from the uppermost layer to the lowermost layer of stack layers are separately formed through repetitive etch processes while reducing the width of one mask pattern.

Benefits of this embodiment of the present invention will now be described with respect to a non-limiting example where there are eight first material layers and eight second material layers.

In the conventional art of FIGS. 1A to 1D, in order to form a stepped structure having 16 steps, 2 processes of forming a mask pattern, 14 processes of reducing the mask pattern, and 16 etch processes must be performed. In contrast, in the embodiment described above with reference to FIGS. 5A to 5D, a stepped structure having 16 steps may be formed with 2 processes of forming a mask pattern, 5 processes of reducing the mask pattern, and 9 etch processes have only to be performed. Accordingly, the turnaround time and the number of processes may be reduced as compared with the know art. Since the number of processes of reducing the mask pattern is reduced as described above, the thickness of the photoresist layer may be reduced and the time taken for the photolithography process may also be reduced.

Figure 6E:
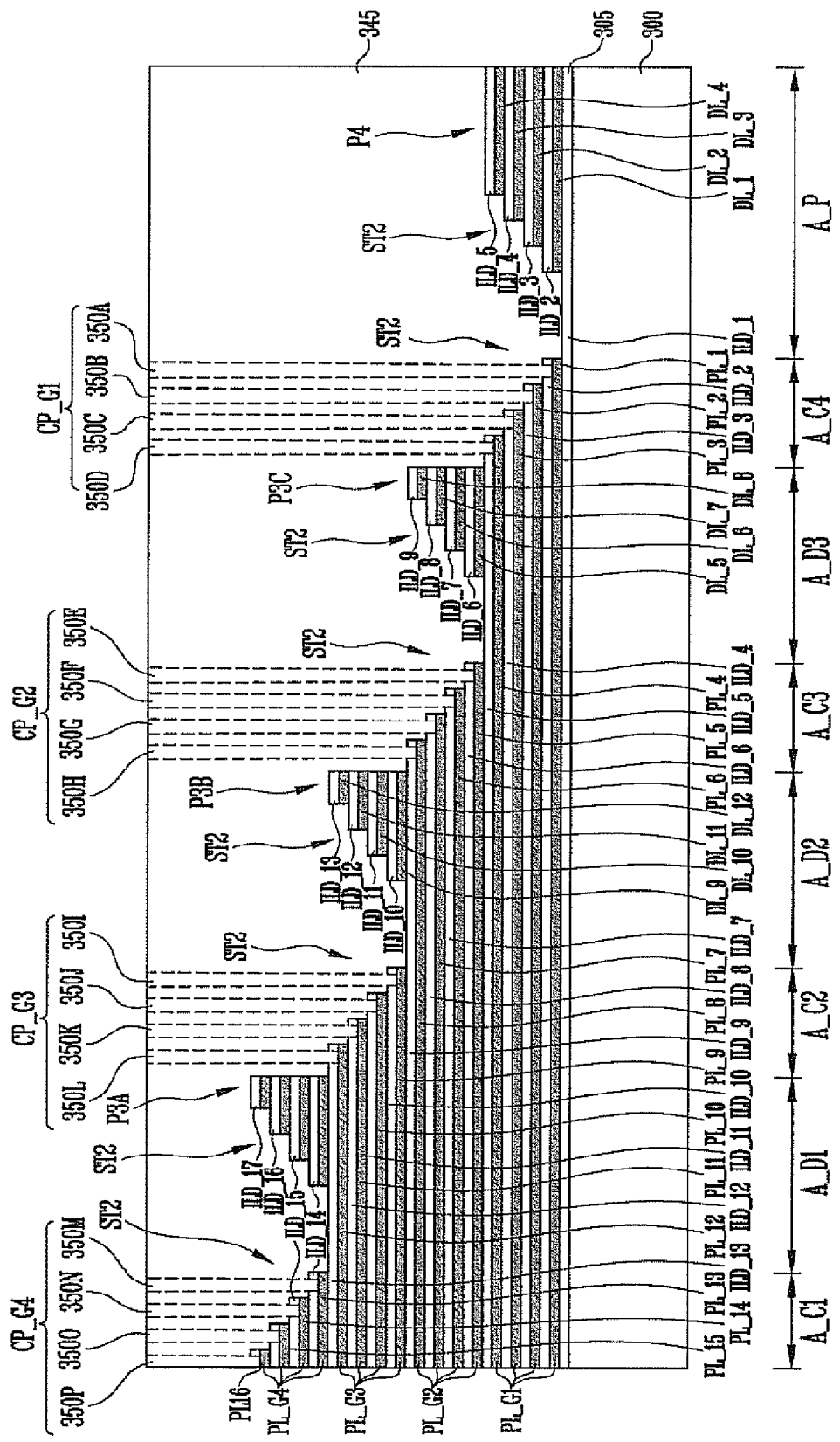

Referring to FIG. 6E, after removing the mask pattern 340B and performing a cleaning process for removing residual substances, a subsequent and predetermined process is performed. The subsequent process varies depending on the compositions of the first material layers 315A to 315P and the second material layers 325A to 325P as described above with reference to FIG. 3G, FIG. 4A and FIG. 4B.

As described above with reference to FIG. 3G, FIG. 4A and FIG. 4B, pad layers PL_1 to PL_16, insulating layers ILD_1 to ILD_17, and dummy layers DL_1 to DL_16 are formed. The pad layers PL_1 to PL_16 are separated into contact groups PL_G1 to PL_G4. The pad layers PL_1 to PL_16, which form the contact groups PL_G1 to PL_G4, respectively, are stacked so that the second stepped structures ST2 are formed. Dummy contact structures P3A, P3B, and P3C are formed in the dummy contact regions A_D1 to A_D3 and are in proximity to the contact groups PL_G4 to PL_G2, respectively. Dummy contact structure P4 is formed in the peripheral region A_P in proximity to the contact group PL_G1. The dummy contact structures P3A, P3B, P3C and P4 include the same stack layers as the respective contact groups PL_G4 to PL_G1. Each of the dummy contact structures P3A, P3B, P3C, and P4 and a corresponding contact group PL_G1 to PL_G4 are symmetrically formed and have steps arranged to face one another.

After forming the pad layers PL_1 to PL_16, a process of forming a silicide layer, a process of forming an insulating layer 345, and a process of polishing a surface of the insulating layer 345 are performed, as described above with reference to FIG. 3G. When performing the process of polishing the insulating layer 345, the dummy contact structures P3A, P3B, P3C, and P4 may reduce the dishing phenomenon of the insulating layer 345, as described above.

Next, contact holes through which the pad layers PL_1 to PL_16 are exposed are formed by an etch process. Contact plugs 350A to 350P, coupled to the respective pad layers PL_1 to PL_16, are formed by filling the contact holes with a conductive layer. In FIG. 6E, regions having the contact plugs 350A to 350P formed are indicated by dotted lines. The contact plugs 350A to 350P are formed over the second stepped structures ST2 of contact groups. The contact plugs 350A to 350P are grouped into contact plug groups CP_G1 to CP_G4 corresponding to the contact groups PL_G1 to PL_G4, respectively.

Figure 7:
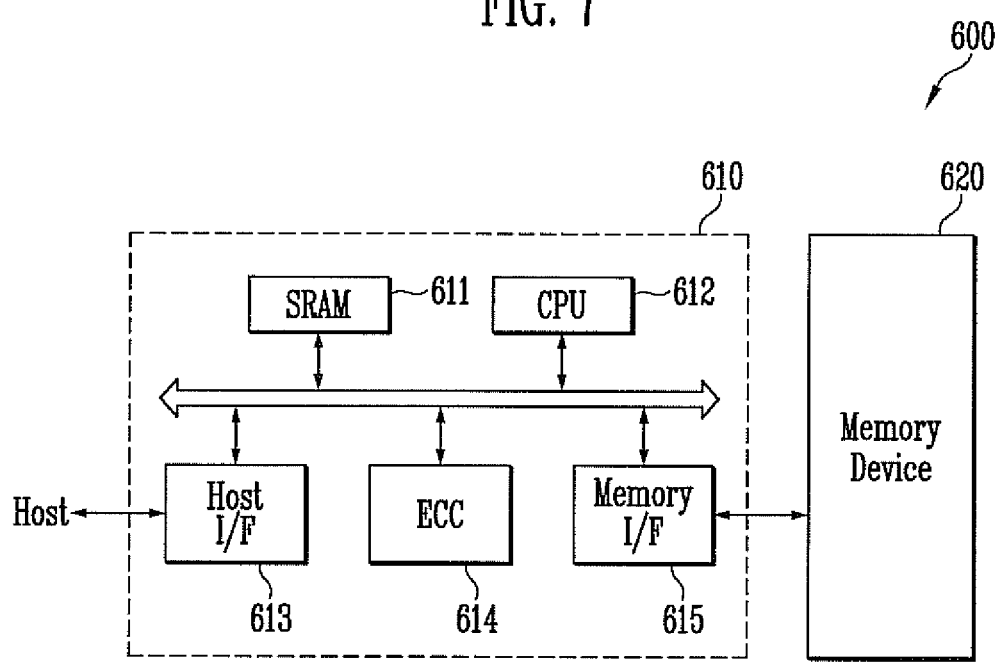
FIG. 7 is a schematic block diagram of a memory system according to one embodiment of the present invention.

FIG. 7 is a schematic block diagram of a memory system according to one embodiment of the present invention.

Referring to FIG. 7, the memory system 600 according to one embodiment of the present invention includes a memory device 620 and a memory controller 610.

The memory device 620 may include the 3-D nonvolatile memory device shown in any of the above-described embodiments. Furthermore, the memory device 620 may further include other forms of semiconductor memory devices, such as a DRAM device or an SRAM device employing the above-described invention.

The memory controller 610 controls the exchange of data between a host and the memory device 620. The memory controller 610 may include a central processing unit (CPU) 612 for controlling the overall operation of the memory system 600. The memory controller 610 may include SRAM 611 used as the operating memory of the CPU 612. The memory controller 610 may further include a host interface (I/F) 613 and a memory I/F 615. The host I/F 613 may be equipped with a data exchange protocol between the memory system 600 and the host. The memory I/F 615 may couple the memory controller 610 and the memory device 620. The memory controller 610 may further include an error correction code block ECC 614. The ECC 614 may detect errors in data read from the memory device 620 and correct the detected errors. Although not shown, the memory system 600 may further include a ROM device for storing code data for interfacing with the host. The memory system 600 may be used as a portable data storage card. In some embodiments, the memory system 600 may be embodied using a solid state disk (SSD) that may replace the hard disk of a computer system.

As described above, in accordance with this disclosure, the stack layers are classified into groups, and stepped structures are formed in the sides of the stack layers, classified into the groups, at the same time. Accordingly, the stack layers exposed through the stepped structure may have a uniform width, and the number of processes and the turnaround time for forming the stepped structures may be reduced.

What is claimed is:

1. A nonvolatile memory device, comprising:
a substrate including a cell region, contact regions and dummy contact regions, where the contact regions and the dummy contact regions alternately are disposed;
a plurality of word lines stacked at the cell region of the substrate;
contact groups stacked at the contact regions and the dummy contact regions of the substrate, where the contact groups include a plurality of pad layers being coupled to the word lines, and each of the contact groups has stepped structure disposed at a corresponding contact region.

2. The nonvolatile memory device of claim 1, further comprising:
dummy contact structures disposed at the dummy contact regions of the substrate, where each of the dummy contact structures has a side facing the stepped structure of a corresponding contact group and symmetrical with respect to the stepped structure of the corresponding contact group.

3. The nonvolatile memory device of claim 2, where the contact groups and the dummy contact structures are spaced apart from each other at a specific interval.

4. A method of manufacturing a nonvolatile memory device, the method comprising:
forming stack groups on a substrate including contact regions and dummy contact regions alternately disposed, each of the stack groups comprising a plurality of stack layers, where each stack layer, of the plurality of stack layers, includes a first material layer and a second material layer; and
forming stepped structures, each having a plurality of steps, where each step, of the plurality of steps, is formed using one of the plurality of stack layers, and where the stepped structures are patterned, in the contact regions, from corresponding stack groups.

5. The method of claim 4, where forming the stepped structures comprises:
forming a first stepped structure by patterning the plurality of stack layers, of each of the stack groups, using a first mask pattern so that the stack groups form steps of the first stepped structure; and
forming a second stepped structure by patterning the plurality of stack layers, of each of the plurality of stack groups, using a second mask pattern so that the stack layers form steps of the second stepped structure.

6. The method of claim 5, where forming the second step structure further comprises:
forming dummy stack structures in the dummy contact regions.

7. The method of claim 6, where each of the dummy stack structures has a side facing the second stepped structure of a corresponding stack group and symmetrical with respect to the second stepped structure of the corresponding stack group.

8. The method of claim 4, where:
each of the dummy contact regions has a width that is greater than a width of each of the contact regions.

9. The method of claim 6, where:
a width of a portion of the second mask pattern, which covers each of the contact regions is substantially the same as a width of a portion of the second mask pattern, which covers each of the dummy contact regions.

10. The method of claim 6, where forming the first stepped structure further comprises:
forming the first mask pattern over the stack layers;
etching the plurality of stack layers using the first mask pattern to expose a lowermost stack group, from among the stack groups, corresponding to a contact region, where the lowermost stack group forms a first step in the first stepped structure; and
performing a series of etching steps, where each of the series of etching steps exposes a next highest stack group, until a penultimate stack group is exposed,
where a size of the first mask pattern is reduced with each subsequent etching step.

11. The method of claim 4, where:
the first material layer is an interlayer insulating layer, and the second material layer is a conductive layer.

12. The method of claim 4, where:
the first material layer is a sacrificial layer, and
the second material layer is an interlayer insulating layer.

13. The method of claim 12, further comprising:
removing the sacrificial layer after the corresponding stack groups are patterned to form the stepped structures; and
filling regions from which the sacrificial layer has been removed with a conductive layer.

14. The method of claim 4, where:
the first material layer is a conductive layer, and
the second material layer is a sacrificial layer.

15. The method of claim 14, further comprising:
removing the sacrificial layer after the corresponding stack groups are patterned to form the stepped structures; and
filling regions from which the sacrificial layer has been removed with an interlayer insulating layer.

* * * * *